United States Patent
Kurosu et al.

(10) Patent No.: US 12,062,730 B2
(45) Date of Patent: Aug. 13, 2024

(54) PHOTOVOLTAIC MODULE

(71) Applicant: KYOCERA CORPORATION, Kyoto (JP)

(72) Inventors: Keita Kurosu, Yokohama (JP); Yusuke Miyamichi, Hikone (JP); Shoei Sato, Yokohama (JP); Satoshi Kitayama, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/767,435

(22) PCT Filed: Oct. 2, 2020

(86) PCT No.: PCT/JP2020/037546

§ 371 (c)(1),
(2) Date: Apr. 8, 2022

(87) PCT Pub. No.: WO2021/070743

PCT Pub. Date: Apr. 15, 2021

(65) Prior Publication Data

US 2024/0072186 A1 Feb. 29, 2024

(30) Foreign Application Priority Data

Oct. 11, 2019 (JP) ................................. 2019-187786

(51) Int. Cl.
*H01L 31/049* (2014.01)
*H01L 31/048* (2014.01)

(52) U.S. Cl.
CPC ........ *H01L 31/049* (2014.12); *H01L 31/0481* (2013.01)

(58) Field of Classification Search
CPC .......................... H01L 31/049; H01L 31/0481
See application file for complete search history.

(56) References Cited

U.S. PATENT DOCUMENTS

| 6,204,443 B1 | 3/2001 | Kiso et al. |
| 2004/0003840 A1 | 1/2004 | Umemoto |

(Continued)

FOREIGN PATENT DOCUMENTS

| JP | H08194117 A | 7/1996 |
| JP | 2001250965 A | 9/2001 |

(Continued)

OTHER PUBLICATIONS

Mozumder et al., "Recent developments in multifunctional coatings for solar panel applications: A review", Solar Energy Materials and Solar Cells 189 (2019) 75-102. (Year: 2019).*

*Primary Examiner* — Tae-Sik Kang
(74) *Attorney, Agent, or Firm* — HAUPTMAN HAM, LLP

(57) ABSTRACT

A photovoltaic module includes a front protective layer, a back protective layer, a plurality of solar cells, and a filler. The front protective layer is transmissive to light and has a first surface and a second surface opposite to the first surface. The back protective layer faces the second surface. The plurality of solar cells are between the second surface and the back protective layer. The filler is between the front protective layer and the plurality of solar cells and covers the plurality of solar cells. The filler includes a material with a chemical structure to generate a free acid. The front protective layer includes a weather-resistance resin. At least a part of the first surface is exposed to a space external to the photovoltaic module.

5 Claims, 14 Drawing Sheets

(56) References Cited

U.S. PATENT DOCUMENTS

2009/0260675 A1* 10/2009 Erdemli ................ H01L 31/049
  136/251
2019/0312164 A1* 10/2019 Sugiyama ............. H01L 31/048

FOREIGN PATENT DOCUMENTS

| JP | 200414791 A | 1/2004 |
| JP | 2011077081 A | 4/2011 |
| JP | 201191303 A | 5/2011 |
| JP | 20124146 A | 1/2012 |
| JP | 201460390 A | 4/2014 |
| JP | 2019140273 A | 8/2019 |
| JP | 202072159 A | 5/2020 |

* cited by examiner

Ib-Ib

| Material | Thickness (mm) | WVTR (g/m²/day) | MTTF | | | |
|---|---|---|---|---|---|---|
| | | | Pm ▼10% | Pm ▼15% | Pm ▼20% | Pm ▼30% |
| Glass | 3.2 | 0 | 1.00 | 1.00 | 1.00 | 1.00 |
| FEP | 0.1 | 0.9 | 1.09 | 1.71 | 1.89 | 3.35 |
| ETFE | 0.1 | 4.9 | 0.81 | 2.62 | 3.39 | 4.78 |

VIb-VIb

IXb-IXb

XI-XI

XIIb-XIIb

XIIIb-XIIIb

PHOTOVOLTAIC MODULE

CROSS-REFERENCE TO RELATED APPLICATION

The present application is a National Phase entry based on PCT Application No. PCT/JP2020/037546 filed on Oct. 2, 2020, entitled "SOLAR CELL MODULE", which claims the benefit of Japanese Patent Application No. 2019-187786, filed on Oct. 11, 2019, entitled "SOLAR CELL MODULE".

FIELD

Embodiments of the present disclosure relates generally to a photovoltaic module.

BACKGROUND

A known photovoltaic module includes a planar array of solar cells that are electrically connected to one another between a light transmissive member and a back plate.

This photovoltaic module includes, for example, multiple solar cells between the light transmissive member, such as a glass substrate, and the back plate, such as a back sheet, and a filler mainly containing ethylene-vinyl acetate (EVA) covering these solar cells.

SUMMARY

One or more photovoltaic modules are disclosed.

In one embodiment, a photovoltaic module includes a front protective layer, a back protective layer, a plurality of solar cells, and a filler. The front protective layer is transmissive to light and has a first surface and a second surface opposite to the first surface. The back protective layer faces the second surface. The plurality of solar cells are between the second surface and the back protective layer. The filler is between the front protective layer and the plurality of solar cells and covers the plurality of solar cells. The filler includes a material with a chemical structure to generate a free acid. The front protective layer includes a weather-resistance resin. At least a part of the first surface is exposed to a space external to the photovoltaic module.

In one embodiment, a photovoltaic module includes a front protective layer, a back protective layer, a plurality of solar cells, and a filler. The front protective layer is transmissive to light and has a first surface and a second surface opposite to the first surface. The back protective layer faces the second surface. The plurality of solar cells are between the second surface and the back protective layer. The filler is between the front protective layer and the plurality of solar cells and covers the plurality of solar cells. The filler includes a material with a chemical structure to generate a free acid. The front protective layer has a plurality of microthrough-holes each extending from the first surface to the second surface. The front protective layer is whether-resistant. At least a part of the first surface is exposed to a space external to the photovoltaic module.

DETAILED DESCRIPTION

Figure 1A:
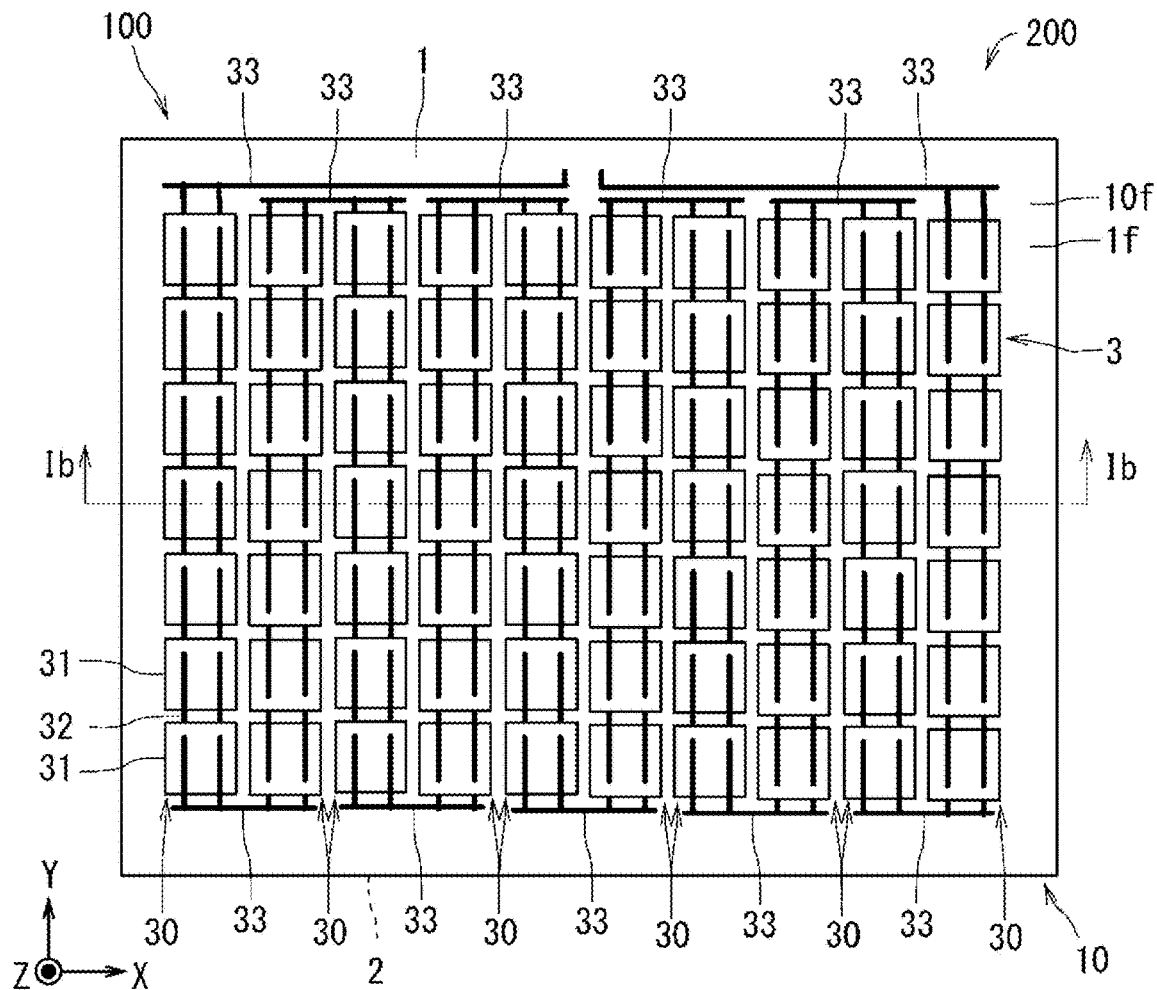
FIG. 1A illustrates a plan view of a photovoltaic module according to a first embodiment, showing an example appearance.

A photovoltaic module includes, for example, a light transmissive member such as a glass substrate, a back plate such as a back sheet, and a planar array of multiple solar cells that are electrically connected to one another between the light transmissive member and the back plate. This photovoltaic module includes, for example, multiple solar cells between the light transmissive member and the back plate, and a filler mainly containing ethylene-vinyl acetate (EVA) covering these solar cells.

In this photovoltaic module, for example, heat and moisture can cause EVA to produce a free acid such as acetic acid, which may corrode the electrodes of the solar cells. For example, such a free acid may also corrode the joints between the electrodes of the solar cells and the wires. Once the electrodes or the joints of the solar cells corrode, the photovoltaic module may have a lower output and may have lower maintainability (long-term reliability) of its output over a long period of time.

The inventors of the present disclosure have developed a technique for improving the long-term reliability of photovoltaic modules.

The technique will be described in first to sixth embodiments with reference to the drawings. Throughout the drawings, components with the same structures and functions are given the same reference numerals and will not be described repeatedly. The drawings are schematic. FIGS. 1A to 3A and FIGS. 4A to 14B are labeled with the right-handed XYZ coordinate system. In this XYZ coordinate system, the longitudinal direction of a front surface 10f of a solar panel 10 is +X direction, the lateral direction of the front surface 10f is +Y direction, and the direction normal to the front surface 10f perpendicular to both +X and +Y directions is +Z direction.

1. First Embodiment

1-1. Photovoltaic Module

A photovoltaic module 100 according to a first embodiment will now be described with reference to FIGS. 1A to 3B.

Figure 1B:
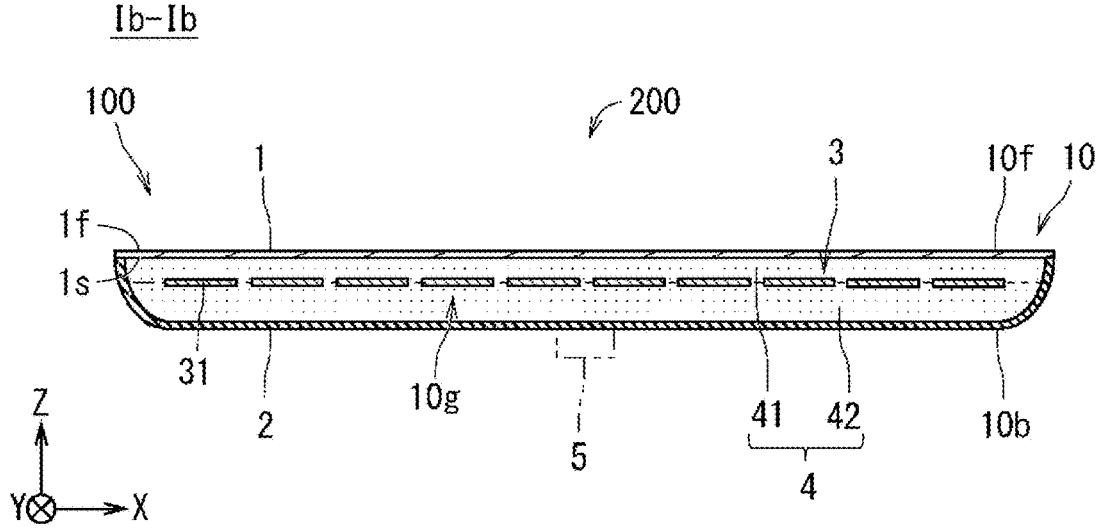
FIG. 1B illustrates an imaginary cross-sectional view of the photovoltaic module taken along line Ib-Ib in FIG. 1A.

As shown in FIGS. 1A and 1B, the photovoltaic module 100 includes, for example, a solar panel 10. The solar panel 10 includes a light-receiving surface 10f (also referred to as a front surface) to mainly receive incident light, and a back surface 10b opposite to the front surface 10f. In the first embodiment, the front surface 10f faces in the +Z direction. The back surface 10b faces in the −Z direction. The +Z direction is set to, for example, a direction toward the sun culminating in the south. In the example of FIG. 1A, the front surface 10f is rectangular. As shown in FIG. 1B, the photovoltaic module 100 may include, for example, a terminal box 5. For example, the terminal box 5 is located on the back surface 10b of the solar panel 10 and can output electricity generated by the solar panel 10 to an external device. The photovoltaic module 100 may be fixed with, for example, an adhesive on a highly rigid plate (also referred to as a plate member). In this structure, for example, the back surface 10b of the solar panel may be fixed on the surface of the plate member with, for example, an adhesive. For example, the terminal box 5 may be fixed on the back surface of the plate member with, for example, an adhesive. The photovoltaic module 100 may also include, for example, a frame. For example, the frame may extend along the periphery of the solar panel 10 and protect the periphery of the solar panel 10.

As shown in FIGS. 1A and 1B, the solar panel 10 includes, for example, a front protective layer 1, a back protective layer 2, a solar cell array 3, and a filler 4.

1-1-1. Front Protective Layer

The front protective layer 1 has, for example, a first surface 1f and a second surface 1s. In the first embodiment, the first surface 1f is, for example, the front surface 10f of the solar panel 10. In the example of FIGS. 1A and 1B, the first surface 1f is exposed to a space 200 outside the photovoltaic module 100 (also referred to as an external space). The second surface 1s is opposite to the first surface 1f.

The front protective layer 1 is, for example, transmissive to light. More specifically, the front protective layer 1 transmits, for example, light with a wavelength in a specific range. The wavelength in the specific range includes, for example, the wavelength of light that can be converted by the solar cell array 3. The wavelength in the specific range including the wavelength of light with high irradiation intensity included in sunlight can improve the photoelectric conversion efficiency of the photovoltaic module 100.

The material for the front protective layer 1 may be, for example, a weather-resistant resin. In other words, the front protective layer 1 may be, for example, a layer of weather-resistant resin. Being weather-resistant herein refers to, for example, being less likely to change, or more specifically, deform, discolor, or deteriorate in outdoor use. The front protective layer 1 being formed from a resin reduces entry of moisture such as water droplets from, for example, the external space 200 toward the solar cell array 3 in the photovoltaic module 100 and also allows passage of moisture from the filler 4 to the external space 200 (in other words, being moisture-permeable and watertight). The weather-resistant resin may be, for example, a fluorine resin. Examples of the fluorine resin include fluorinated ethylene propylene (FEP), ethylene tetrafluoroethylene (ETFE), and ethylene chlorotrifluoroethylene (ECTFE). The front protective layer 1 may include two or more layers each formed from a weather-resistant resin. In this case, the front protective layer 1 may be formed from two or more different fluorine resins. A fluorine resin used for the front protective layer 1 may be at least one of FEP, ETFE, or ECTFE.

The thickness of the front protective layer 1 is, for example, in a range of about 0.05 to 0.5 mm 1-1-2. Solar Cell Array The solar cell array 3 is located, for example, between the front protective layer 1 and the back protective layer 2. As shown in FIGS. 1A and 1B, the solar cell array 3 includes, for example, multiple solar cells 31. Thus, the solar cells 31 are located, for example, between the second surface 1s of the front protective layer 1 and the back protective layer 2. In the first embodiment, the multiple solar cells 31 are arranged two-dimensionally. In the example of FIGS. 1A and 1B, the multiple solar cells 31 are in a planar array across the second surface 1s of the front protective layer 1.

The solar cell array 3 further includes, for example, multiple first wires 32 and multiple second wires 33. The solar cell array 3 includes, for example, multiple (ten in the present embodiment) solar cell strings 30. Each of the solar cell strings 30 includes, for example, multiple (seven in the present embodiment) solar cells 31 and multiple first wires 32. Each of the first wires 32 electrically connects, for example, two adjacent ones of the solar cells 31. Each of the second wires 33 electrically connects, for example, two adjacent ones of the solar cell strings 30. In the example of FIGS. 1A and 1B, the second wire 33 connected to the outermost one of the solar cell strings 30 in the −X direction, and the second wire 33 connected to the outermost one of the solar cell strings 30 in the +X direction are drawn outside the solar panel 10. These two second wires 33 are drawn outside the solar panel 10 through through-holes in, for example, the back protective layer 2.

Figure 2A:
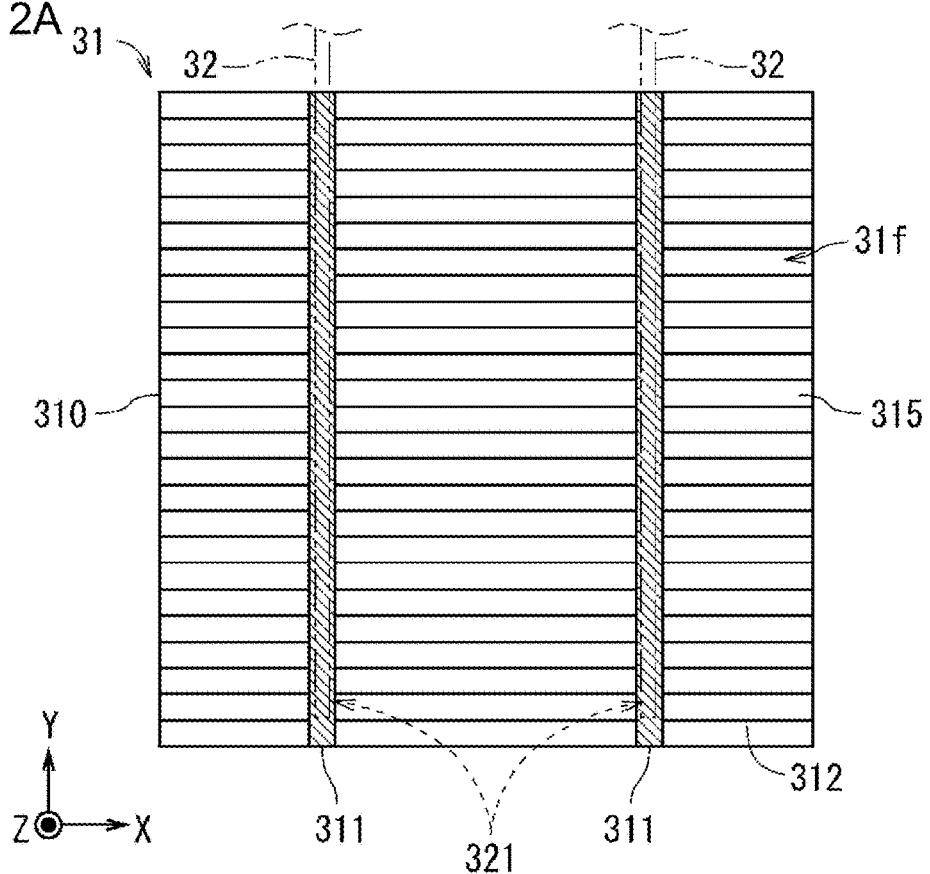
FIG. 2A illustrates a diagram of a solar cell as viewed in a plan view of its first cell surface.
Figure 2B:
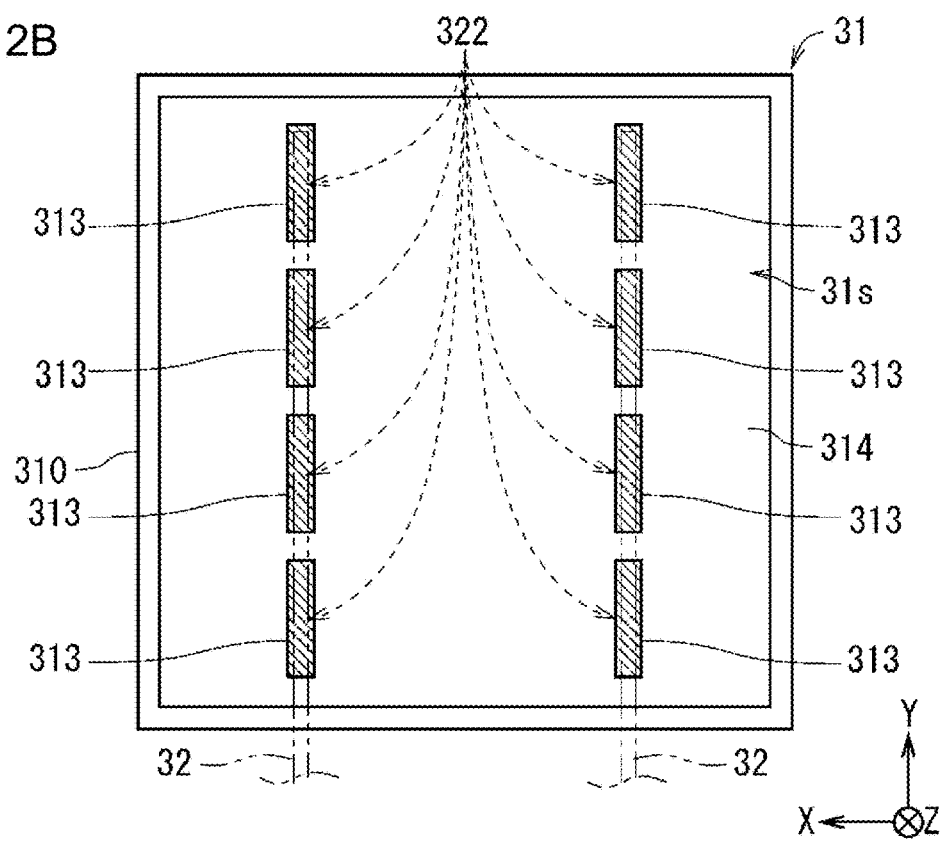
FIG. 2B illustrates a diagram of the solar cell as viewed in a plan view of its second cell surface.

Each of the solar cells 31 can, for example, convert light energy into electrical energy. As shown in FIGS. 2A and 2B, each of the solar cells 31 includes a surface 31f at the front (also referred to as a first cell surface) and another surface 31s opposite to the first cell surface 31f (also referred to as a second cell surface). In the example of FIGS. 2A and 2B, the first cell surface 31f faces in the +Z direction, and the second cell surface 31s faces in the −Z direction. In this structure, for example, the first cell surface 31f mainly serves as an incident surface to receive light (also referred to as a light-receiving surface), and the second cell surface 31s mainly serves as a non-incident surface to receive no light (also referred to as a non-light-receiving surface).

In the first embodiment, as shown FIGS. 2A and 2B, each of the solar cells 31 includes a semiconductor substrate 310, first output electrodes 311, first collector electrodes 312, second output electrodes 313, and a second collector electrode 314.

The semiconductor substrate 310 may be formed from, for example, a crystalline semiconductor such as crystalline silicon, an amorphous semiconductor such as amorphous silicon, or a semiconductor compound containing, for example, four elements, copper, indium, gallium, and selenium, or two elements, cadmium and tellurium. In the present embodiment, the semiconductor substrate 310 is formed from crystalline silicon. In this case, the semiconductor substrate 310 has a main region with a first conductivity type (also referred to as a first conductivity type region) and a region with a second conductivity type (also referred to as a second conductivity type region) opposite to the first conductivity type. The first conductivity type region is located on, for example, a portion of the semiconductor substrate 310 at the second cell surface 31s in the −Z direction. The second conductivity type region is located on, for example, a surface portion of the semiconductor substrate 310 at the first cell surface 31f in the +Z direction. The first conductivity type may be, for example, p-type. In this case, the second conductivity type is n-type. The first conductivity type may be, for example, n-type. In this case, the second conductivity type is p-type. The semiconductor substrate 310 thus has a p-n junction at the interface between the first conductivity type region and the second conductivity type region.

The first output electrodes 311 and the first collector electrodes 312 are located on, for example, a surface portion of the semiconductor substrate 310 at the first cell surface 31f. The first output electrodes 311 may be, for example, busbar electrodes. The first collector electrodes 312 may be, for example, finger electrodes. In the example of FIG. 2A, two substantially parallel first output electrodes 311 are located on a portion of the semiconductor substrate 310 at the first cell surface 31f, and many substantially parallel first collector electrodes 312 are aligned substantially orthogonally to the two first output electrodes 311. An insulating film as an anti-reflection coating 315 containing, for example, silicon nitride, may be located in an area on the second conductivity type region of the semiconductor substrate 310 without any first output electrodes 311 and any first collector electrodes 312. For example, the first output electrodes 311 formed from silver as their main component may be formed by applying a silver paste in an intended pattern by screen printing or another technique and then firing the structure. The main component refers to the component with the highest ratio (also referred to as a content) of all the constituents. The silver paste may be, for example, a metal paste containing powder of metal containing silver as the main component, an organic vehicle, and glass frit. For example, the first collector electrodes 312 formed from silver as their main component may be formed by applying a silver paste in an intended pattern by screen printing or another technique and then firing the structure, in the same manner as the first output electrodes 311. The first output electrodes 311 and the first collector electrodes 312 may be formed, for example, through separate processes or the same process.

The second output electrodes 313 and the second collector electrode 314 are located on, for example, a surface portion of the semiconductor substrate 310 at the second cell surface 31s. The second output electrodes 313 may be, for example, busbar electrodes. In the example of FIG. 2B, two rows of second output electrodes 313 are located parallel to each other in the +Y direction on a portion of the semiconductor substrate 310 at the second cell surface 31s. The second collector electrode 314 is located on a portion of the semiconductor substrate 310 at the second cell surface 31s across substantially the entire area without any second output electrodes 313, except for the area having the second output electrodes 313 and the second collector electrode 314 that are stacked on each other and thus are interconnected. Each of the two rows of second output electrodes 313 includes, for example, four electrodes aligned in the row. For example, a passivation film that is a thin film of oxide or nitride such as aluminum oxide may be located in an intended pattern between the first conductivity type region of the semiconductor substrate 310 and the second output electrodes 313 and between the first conductivity type region of the semiconductor substrate 310 and the second collector electrode 314. The second output electrodes 313 formed from silver as their main component may be formed by applying a silver paste in an intended pattern by screen printing or another technique and then firing the structure, in the same manner as the first output electrodes 311. The second collector electrode 314 formed from aluminum (Al) as its main component may be formed by applying an aluminum paste in an intended pattern by screen printing or another technique and then firing the structure. The aluminum paste may be, for example, a metal paste containing powder of metal containing Al as the main component, an organic vehicle, and glass frit.

For example, the first wires 32 electrically connect the first output electrodes 311 included in one solar cell 31 with the second output electrodes 313 included in another solar cell 31 adjacent to this solar cell 31. In the example of FIGS. 2A and 2B, the imaginary two-dot chain lines indicate the outer edges of the first wires 32 attached to each of the solar cells 31. The first wires 32 are, for example, bonded to the first output electrodes 311 and the second output electrodes 313. More specifically, for example, a joint 321 (also referred to as a first joint) is located between each first wire 32 and the corresponding first output electrode 311. The first joint 321 joins the first wire 32 and the first output electrode 311 together. For example, each first wire 32 is bonded to the corresponding first output electrode 311 included in one solar cell 31 at the first joint 321. For example, a joint 322 (also referred to as a second joint) is located between each first wire 32 and the corresponding second output electrode 313. The second joint 322 joins the first wire 32 and the second output electrode 313 together. For example, the first wires 32 for one solar cell 31 are bonded, at the second joints 322, to the second output electrodes 313 included in another solar cell 31 adjacent to this solar cell 31. The first wires 32 may be, for example, conductive metal wire or strips. The material for the first joints 321 and the second joints 322 may be, for example, an alloy with a low melting point, such as solder, or a single metal with a low melting point. More specifically, for example, each first wire 32 may be formed from copper foil with a thickness of about 0.1 to 0.2 mm and a width of about 1 to 2 mm. The entire surface of each first wire 32 may be covered by solder. The first wires 32 are, for example, electrically connected to the first output electrodes 311 and the second output electrodes 313 with solder. In this structure, for example, the first joints 321 may be solder portions located between the first wires 32 and the first output electrodes 311. In this case, for example, the second joints 322 may be solder portions located between the first wires 32 and the second output electrodes 313. The first joints 321 and the second joints 322 may be hereafter simply referred to as joints.

1-1-3. Filler

The filler 4 covers the solar cell array 3 between the front protective layer 1 and the back protective layer 2. More specifically, the filler 4 covers the multiple solar cells 31 between the front protective layer 1 and the back protective layer 2. In other words, the filler 4 covering the solar cell array 3 fills, for example, an area 10g between the front protective layer 1 and the back protective layer 2 (also referred to as a gap area).

In the first embodiment, the filler 4 includes, for example, a filler portion 41 located on the front surface 10f (also referred to as a first filler) and a filler portion 42 located on the back surface 10b (also referred to as a second filler). The first filler 41 covers, for example, the entire surface of the front protective layer 1 of the solar cell array 3. In other words, the first filler 41 covers the multiple solar cells 31 between the front protective layer 1 and the multiple solar cells 31. The second filler 42 covers, for example, the entire surface of the back protective layer 2 of the solar cell array 3. In other words, the second filler 42 covers the multiple solar cells 31 between the back protective layer 2 and the multiple solar cells 31. In the first embodiment, for example, the solar cell array 3 is located between and surrounded by the first filler 41 and the second filler 42. In this structure, for example, the filler 4 retains the installed position of the solar cell array 3.

The filler 4 is, for example, transmissive to light. The filler 4 transmits, for example, light with a wavelength in the specific range described above. With, for example, at least the first filler 41 in the filler 4 (the first filler 41 and the second filler 42) being transmissive to light, incident light on the front surface 10f can reach the solar cell array 3.

The material for the first filler 41 has, for example, the chemical structure that can generate a free acid. The material for the first filler 41 may be, for example, polyvinyl acetal or an acid-modified resin, such as EVA or polyvinyl butyral (PVB). The first filler 41 formed from, for example, EVA, which is relatively inexpensive, can easily achieve high enough performance to protect the multiple solar cells 31. The acid-modified resin may be, for example, a modified polyolefin resin that can be produced by graft modification of a polyolefin resin using acid. Examples of the acid that can be used for graft modification to produce an acid-modified resin include acrylic acid, methacrylic acid, maleic acid, fumaric acid, itaconic acid, maleic anhydride, hemic anhydride, itaconic anhydride, and citraconic anhydride. The free acid may be, for example, an acid unbound to a base. The free acid may be, for example, an acid that can form a solvation in a solution but is unbound to any substance other than the solvent. The chemical structure that can generate a free acid in EVA or PVB may be, for example, the chemical structure of an acetoxy group. A resin with an acetoxy group may generate acetic acid as a free acid through, for example, thermal decomposition and hydrolysis. The material for the second filler 42 may be, for example, polyvinyl acetal or an acid-modified resin, such as EVA or PVB, in the same manner as for the first filler 41. The first filler 41 and the second filler 42 may each contain, for example, two or more different materials.

1-1-4. Back Protective Layer

The back protective layer 2 is, for example, the back surface 10b of the solar panel 10. For example, the back protective layer 2 faces the second surface 1s of the front protective layer 1.

The back protective layer 2 can, for example, protect the solar cell array 3 on the back surface 10b. The back protective layer 2 may be, for example, a back sheet used as the back surface 10b. The thickness of the back sheet is, for example, in a range of about 0.3 to 0.5 mm. The material for the back sheet may be, for example, one resin or at least one resin selected from polyvinyl fluoride (PVF), polyethylene terephthalate (PET), and polyethylene naphthalate (PEN). In the example of FIG. 1B, the back protective layer 2 covers the solar cell array 3 and the filler 4 at the back surface 10b and also at the periphery. The back protective layer 2 is bonded to the periphery of the front protective layer 1. The back protective layer 2 has, for example, the same shape as the front protective layer 1 when viewed in a plan from the back surface 10b. For example, the front protective layer 1 and the back protective layer 2 each have a rectangular profile when viewed in a plan from the back surface 10b.

1-2. Photovoltaic Module Characteristics

As described above, for example, the front protective layer 1 formed from a weather-resistant resin is moisture-permeable and watertight. When, for example, a free acid such as acetic acid occurs in the filler 4 through, for example, thermal decomposition and hydrolysis, the free acid in the filler 4 can be dissipated to the external space 200 through the front protective layer 1, as indicated by the two-dot chain arrows in FIG. 3A. The electrodes and the joints in each solar cell 31 are thus less likely to corrode with the free acid, allowing, for example, the photovoltaic module 100 to have higher long-term reliability.

Figures 3A, 3B:
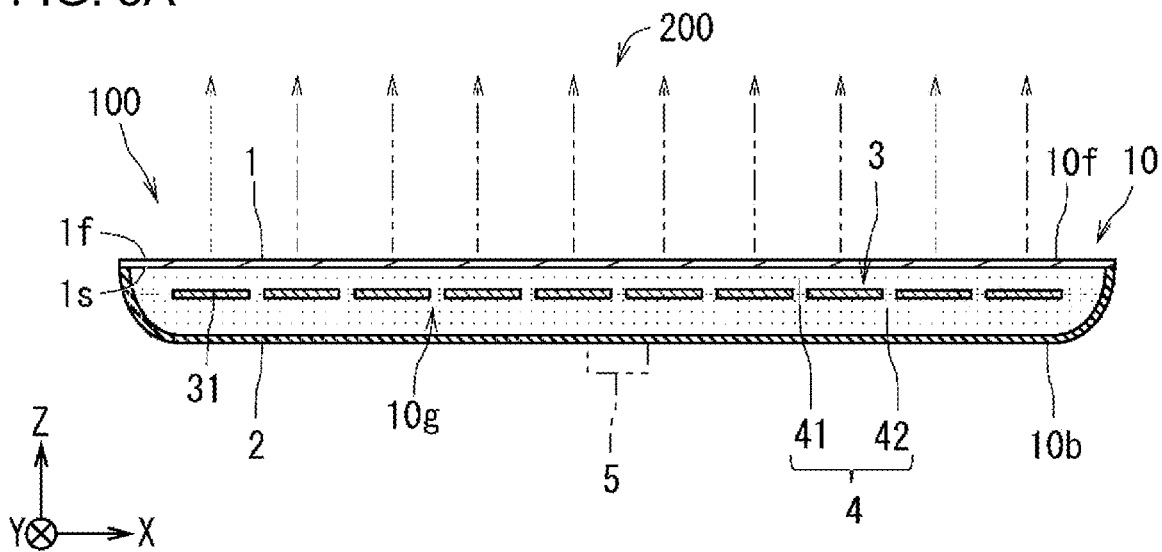
FIG. 3A illustrates a diagram describing dissipation of a free acid occurring in a filler from the photovoltaic module to an external space.
FIG. 3B illustrates a table showing the water vapor transmission rate and the mean time to failure for each material for a front protective layer in the photovoltaic module.

These characteristics will be described below using example measurement results of the water vapor transmission rate (WVTR) and the mean time to failure (MTTF) for each front protective layer 1 formed from a weather-resistant resin, or FEP or ETFE. Example measurement results of the WVTR and the MTTF for the front protective layer 1 formed from glass are also used as a reference example. In the example of FIG. 3B, a plate of glass with a thickness of 3.2 mm (also referred to as a glass plate), a film of FEP with a thickness of 0.1 mm (also referred to as an FEP film), and a film of ETFE with a thickness of 0.1 mm (also referred to as an ETFE film) were prepared as examples of the front protective layer 1.

The WVTR was measured for each of the glass plate, the FEP film, and the ETFE film by measurement in accordance with the Testing Methods for Determination of the Water Vapor Transmission Rate of Moisture-Proof Packaging Materials (Dish method) in JIS Z 0208. The WVTR is the amount of water vapor in grams that can pass through one square meter (1 m$^2$) of film in 24 hours. The WVTR is in g/m$^2$/day.

For the photovoltaic module 100 including the glass plate, the FEP film, or the ETFE film as the front protective layer 1, the MTTF was obtained using a fixed light solar simulator by measuring the time at which the maximum output (Pm) of the photovoltaic module 100 decreases by 10%, 15%, 20%, and 30% from the value in the initial state in a high temperature and high humidity test. Thus, the MTTF indicates the durability of the photovoltaic module 100 under high temperature and high humidity conditions. In FIG. 3B, the MTTF for the photovoltaic module 100 including either the FEP film or the ETFE film as the front protective layer 1 is a value based on the reference value of 1 for the photovoltaic module 100 including the glass plate as the front protective layer 1.

More specifically, the MTTF for the glass plate, specifically the time at which the maximum power (Pm) decreases by 10%, was used as the reference value of 1. The MTTF for the FEP film, specifically the time at which the maximum power (Pm) decreases by 10%, was obtained by dividing the measured value of the MTTF obtained for the FEP film by the measured value of the MTTF obtained for the glass plate. The MTTF for the ETFE film, specifically the time at which the maximum power (Pm) decreases by 10%, was obtained by dividing the measured value of the MTTF obtained for the ETFE film by the measured value of the MTTF obtained for the glass plate.

The MTTF for the glass plate, specifically the time at which the maximum power (Pm) decreases by 15%, was used as the reference value of 1. The MTTF for the FEP film, specifically the time at which the maximum power (Pm) decreases by 15%, was obtained by dividing the measured value of the MTTF obtained for the FEP film by the measured value of the MTTF obtained for the glass plate. The MTTF for the ETFE film, specifically the time at which the maximum power (Pm) decreases by 15%, was obtained by dividing the measured value of the MTTF obtained for the ETFE film by the measured value of the MTTF obtained for the glass plate.

The MTTF for the glass plate, specifically the time at which the maximum power (Pm) decreases by 20%, was used as the reference value of 1. The MTTF for the FEP film, specifically the time at which the maximum power (Pm) decreases by 20%, was obtained by dividing the measured value of the MTTF obtained for the FEP film by the measured value of the MTTF obtained for the glass plate. The MTTF for the ETFE film, specifically the time at which the maximum power (Pm) decreases by 20%, was obtained by dividing the measured value of the MTTF for the ETFE film by the measured value of the MTTF obtained for the glass plate.

The MTTF for the glass plate, specifically the time at which the maximum power (Pm) decreases by 30%, was used as the reference value of 1. The MTTF for the FEP film, specifically the time at which the maximum power (Pm) decreases by 30%, was obtained by dividing the measured value of the MTTF obtained for the FEP film by the measured value of the MTTF obtained for the glass plate. The MTTF for the ETFE film, specifically the time at which the maximum power (Pm) decreases by 30%, was obtained by dividing the measured value of the MTTF obtained for the ETFE film by the measured value of the MTTF obtained for the glass plate.

As shown in FIG. 3B, the WVTR of the glass plate with a thickness of 3.2 mm is 0 g/m$^2$/day. The WVTR of the FEP film with a thickness of 0.1 mm is 0.9 g/m$^2$/day. The WVTR of the ETFE film with a thickness of 0.1 mm is 4.9 g/m$^2$/day.

For the front protective layer 1 being the FEP film, as shown in FIG. 3B, the MTTF at which the maximum output (Pm) decreases by 10% is 1.09, the MTTF at which the maximum output (Pm) decreases by 15% is 1.71, the MTTF at which the maximum output (Pm) decreases by 20% is 1.89, and the MTTF at which the maximum output (Pm) decreases by 30% is 3.35. For the front protective layer 1 being the FTFE film, the MTTF at which the maximum output (Pm) decreases by 10% is 0.81, the MTTF at which the maximum output (Pm) decreases by 15% is 2.62, the MTTF at which the maximum output (Pm) decreases by 20% is 3.39, and the MTTF at which the maximum output (Pm) decreases by 30% is 4.78.

For the FEP film with the WVTR of 0.9 g/m$^2$/day used as the front protective layer 1, the MTTF used for the maximum output (Pm) to decrease is much longer than the MTTF for the glass plate with the WVTR of 0 g/m$^2$/day used as the front protective layer 1. For the ETFE film with the WVTR of 4.9 g/m$^2$/day used as the front protective layer 1, the MTTF used for the maximum output (Pm) to decrease by 15% is much longer than the MTTF for the FEP film with the WVTR of 0.9 g/m$^2$/day used as the front protective layer 1.

The measurement results of the above examples and the above reference example reveal that the solar cells 31 are less likely to deteriorate when the material for the front protective layer 1 is a weather-resistant resin such as FEP or ETFE than when the material for the front protective layer 1 is glass that blocks moisture. The findings suggest that the front protective layer 1 formed from a weather-resistant resin such as FEP or ETFE is moisture-permeable and watertight and allows any free acid occurring in the filler 4 to pass through the front protective layer 1 and to diffuse to the external space 200, allowing the electrodes and joints in the solar cell 31 to be less corrosive and the solar cells 31 to have higher long-term reliability.

1-3. Photovoltaic Module

Figure 4A:
FIGS. 4A to 4C illustrate cross-sectional views of a photovoltaic module according to the first embodiment during manufacture.

A method for manufacturing the photovoltaic module 100 will now be described with reference to FIGS. 4A to 4C.

The front protective layer 1 is first prepared. For the front protective layer 1, for example, a weather-resistant resin film with rectangular front and back surfaces is prepared. The weather-resistant resin may be, for example, a fluorine resin. Examples of the fluorine resin include FEP, ETFE, and ECTFE. One surface of the front protective layer 1, or more specifically the second surface 1s, then undergoes treatment to activate the surface, such as corona treatment or plasma treatment. This allows the front protective layer 1 and the filler 4 to be more closely in contact with each other in a subsequent lamination process described below.

Figure 4B:
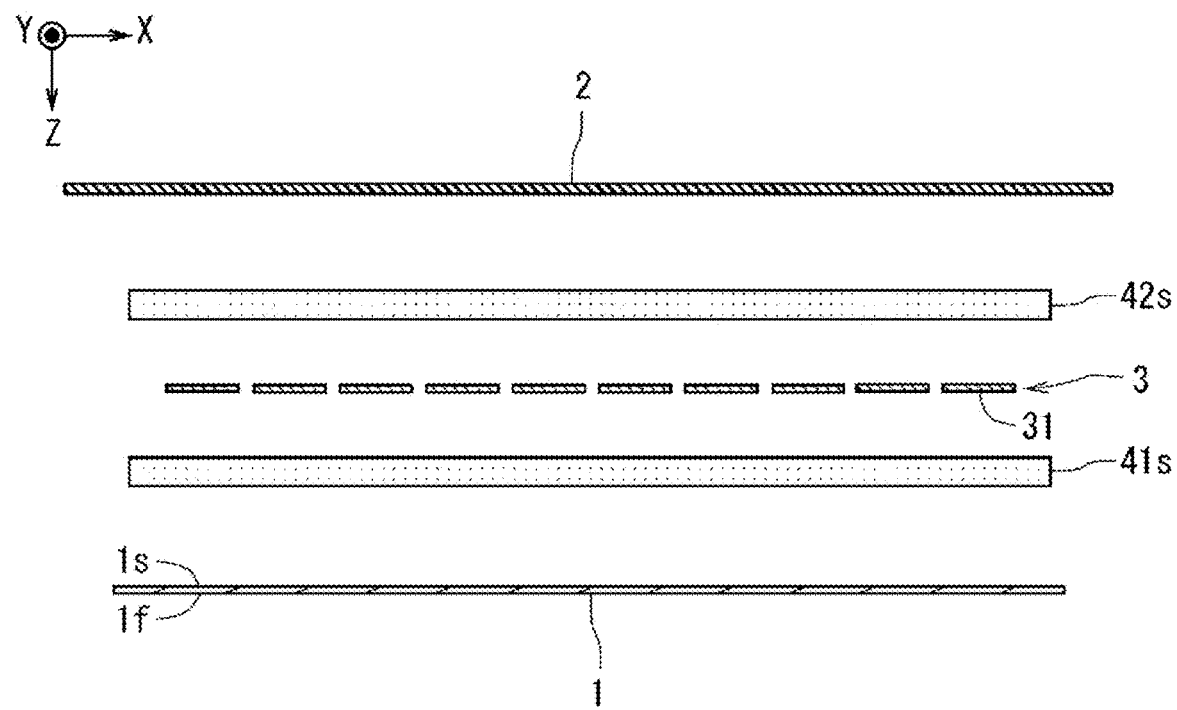
Figure 4C:
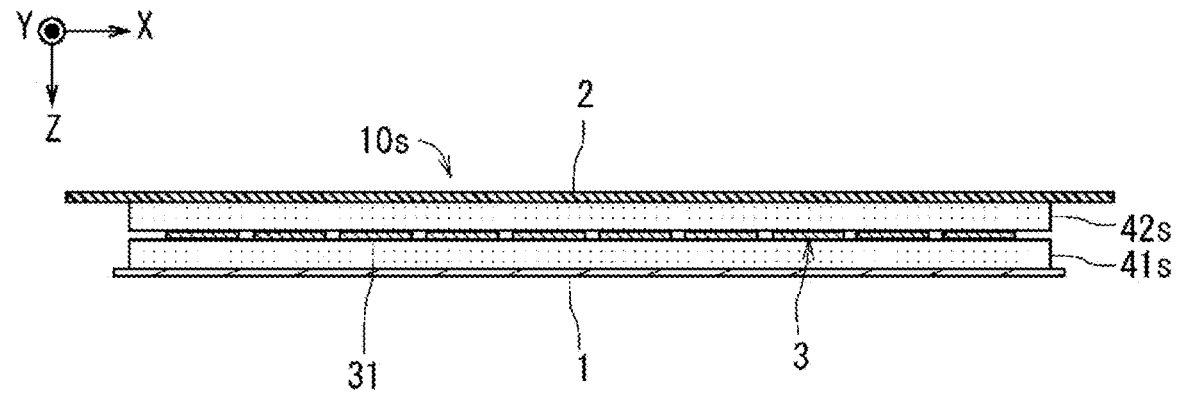

As shown in FIGS. 4B and 4C, for example, the front protective layer 1, a first sheet 41s, the solar cell array 3, a second sheet 42s, and the back protective layer 2 are stacked on one another in the stated order to form a laminate 10s. In this process, wires are drawn as appropriate from the solar cell array 3 out of the solar panel 10 for connection to, for example, a terminal box. The first sheet 41s is, for example, a resin sheet (e.g., EVA) to be the first filler 41. The second sheet 42s is, for example, a resin sheet (e.g., EVA) to be the second filler 42.

The laminate 10s then undergoes, for example, the lamination process. The laminate 10s is integrated using, for example, a lamination device (laminator). The laminator has, for example, a heater plate in a chamber, on which the laminate 10s is placed. The inside of the chamber is then depressurized to about 50 to 150 Pa, while the laminate 10s is being heated to about 100 to 200° C. The heating causes the first sheet 41s and the second sheet 42s to have a certain level of flowability. In this state, the laminate 10s in the chamber is pressed with, for example, a diaphragm sheet, and is thus integrated. This forms the solar panel 10 shown in FIGS. 1A and 1B.

Subsequently, for example, the solar panel 10 is fixed to the front surface of a plate member with, for example, an adhesive. The terminal box 5 may be attached to the back surface of the plate member with, for example, an adhesive. The terminal box 5 as well as, for example, an aluminum frame, may also be attached to the solar panel 10. The wires drawn from the solar cell array 3 out of the solar panel 10 may be connected to the terminals in the terminal box as appropriate. Also, the aluminum frame may be attached to the solar panel 10 along a side surface of the solar panel 10. A sealant with low moisture permeability, such as a butyl resin, may be used to fill any space between the side surface of the solar panel 10 and the frame. This forms the photovoltaic module 100. The photovoltaic module 100 may not have the frame or the terminal box. In other words, the photovoltaic module 100 at least simply includes the solar panel 10.

1-4. Overview of First Embodiment

In the photovoltaic module 100 according to the first embodiment, for example, the material for the front protective layer 1 is a weather-resistant resin. In this structure, for example, the front protective layer 1 is moisture-permeable and watertight. When, for example, a free acid such as acetic acid occurs in the filler 4 through, for example, thermal decomposition and hydrolysis, the free acid in the filler 4 can be dissipated to the external space 200 through the front protective layer 1. The electrodes and the joints in the solar cells 31 are thus less likely to corrode with the free acid, allowing, for example, the photovoltaic module 100 to have higher long-term reliability.

2. Other Embodiments

The present disclosure is not limited to the first embodiment described above and may be changed or modified variously without departing from the spirit and scope of the present disclosure.

2-1. Second Embodiment

Figure 5:
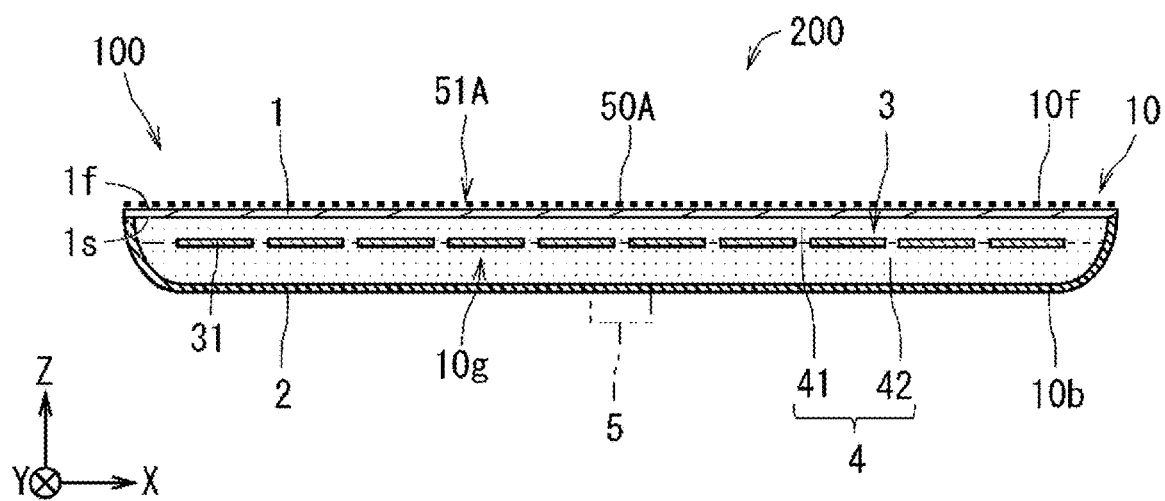
FIG. 5 illustrates an imaginary cross-sectional view of a photovoltaic module according to a second embodiment at a position corresponding to the imaginary cross section in FIG. 1B.
Figure 6A:
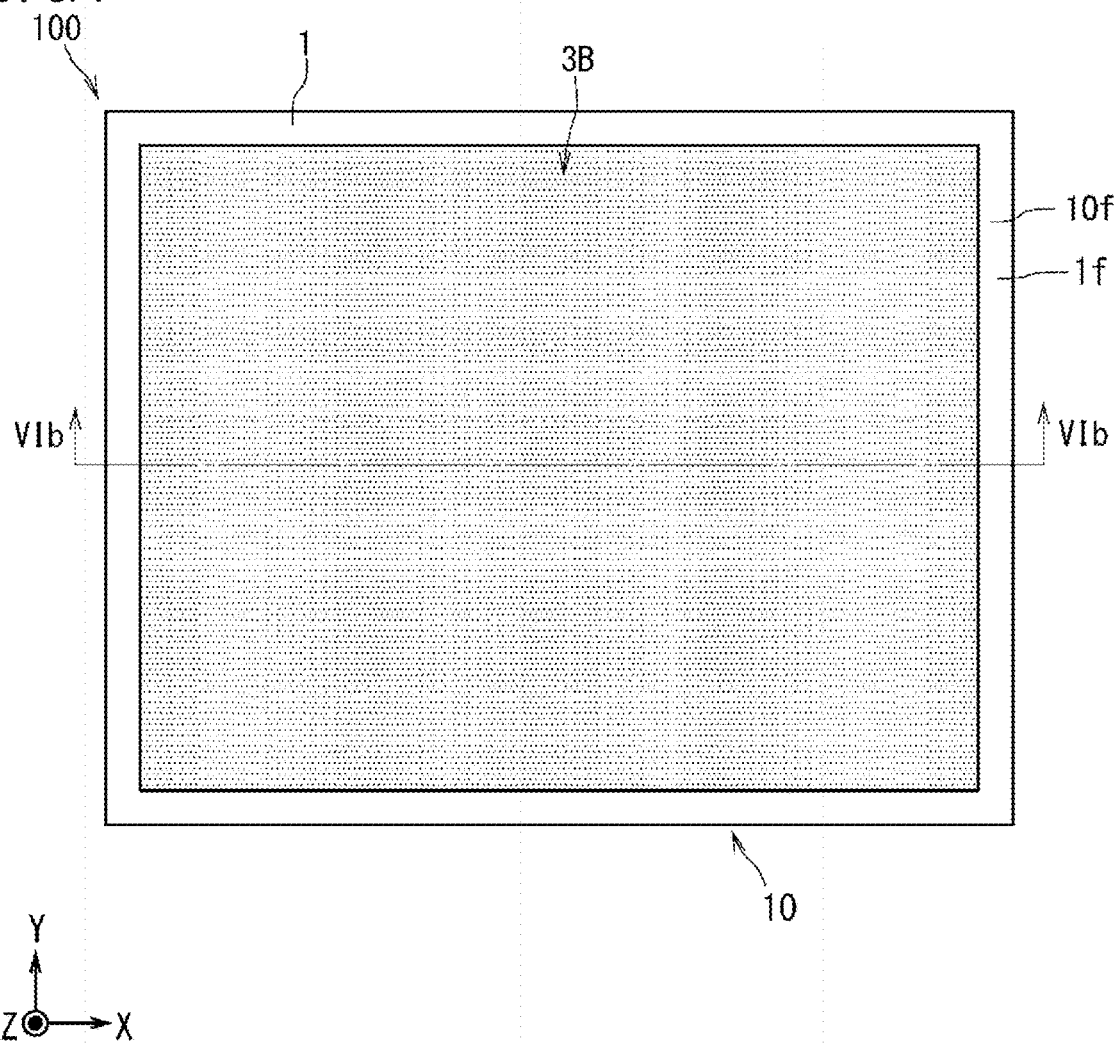
FIG. 6A illustrates a plan view of a photovoltaic module according to a third embodiment, showing an example structure.
Figure 6B:
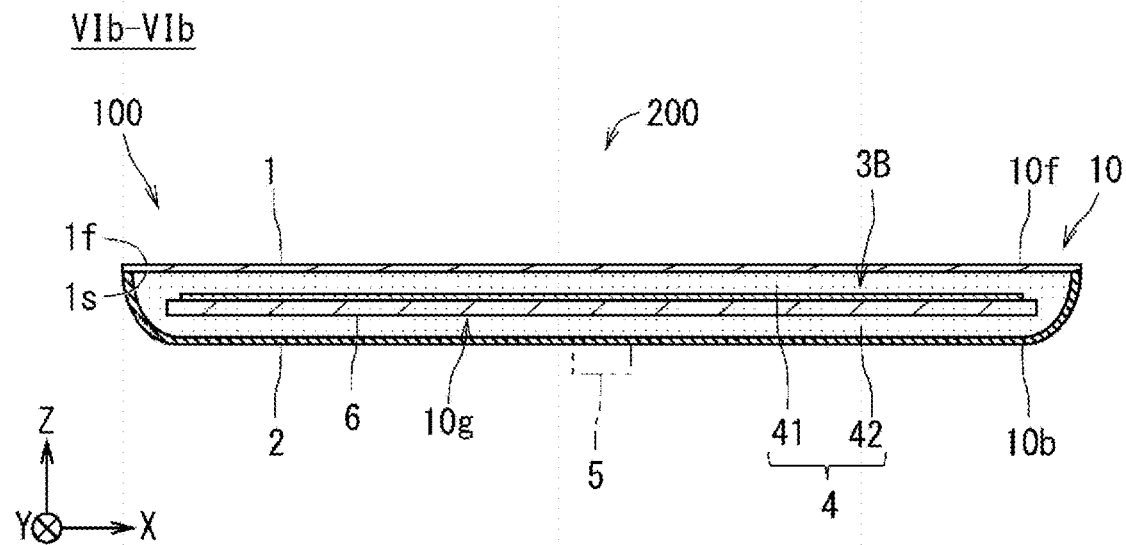
FIG. 6B illustrates an imaginary cross-sectional view of the photovoltaic module taken along line VIb-VIb in FIG. 6A.

In the above first embodiment, for example, a protective film 50A may be on a part of the first surface 1f of the front protective layer 1 as shown in FIG. 5. In other words, the photovoltaic module 100 may also include, for example, the protective film 50A. The protective film 50A can protect, for example, the first surface 1f. This structure reduces scratches on the first surface if of the resin front protective layer 1. The material for the protective film 50A may be, for example, an inorganic material such as silicon oxide or silicon nitride. Such inorganic materials are, for example, weather-resistant.

The protective film 50A has, for example, through-holes 51A extending in the thickness direction. In this structure including the protective film 50A, for example, any free acid occurring in the filler 4 can be dissipated to the external space 200 through the front protective layer 1 and the through-holes 51A in the protective film 50A. With the first surface 1f of the front protective layer 1 being protected by the protective film 50A, any free acid occurring in the filler 4 can be dissipated to the external space 200 through the front protective layer 1. Thus, for example, the first surface 1f of the front protective layer 1 is to be exposed to the external space 200 in the photovoltaic module 100 to allow any free acid occurring in the filler 4 to be dissipated to the external space 200 through the front protective layer 1. The electrodes and the joints in the solar cells 31 are thus less likely to corrode with the free acid, allowing, for example, the photovoltaic module 100 to have higher long-term reliability.

The protective film 50A may be formed by dry deposition such as sputtering or chemical vapor deposition (CVD), or wet deposition such as coating. For the protective film 50A being ultrathin formed by dry deposition, for example, the protective film 50A can have a large number of through-holes 51A. For the protective film 50A formed by dry deposition, for example, a mesh mask can be used to form the protective film 50A with an intended shape and an intended number of through-holes 51A. The protective film 50A with an intended shape and an intended number of through-holes 51A can be formed by applying a liquid containing an inorganic material dissolved in a solvent (also referred to as a coating solution) on the first surface if of the front protective layer 1 through a mesh mask, and then drying the coating solution.

2-2. Third Embodiment

In the above first and second embodiments, for example, the solar cell array 3 may be replaced by a solar cell array 3B including multiple thin film solar cells 31B each including a thin film of semiconductor and transparent electrodes as shown in FIGS. 6A to 7B. Examples of the thin film of semiconductor include a silicon-based thin film, a semiconductor compound-based thin film, and thin films of other semiconductors. The silicon-based thin film may be, for example, a thin film of amorphous silicon or a thin film of polycrystalline silicon. The semiconductor compound-based thin film may be, for example, a thin film of a semiconductor compound with a chalcopyrite structure such as copper indium selenide (CIS) or copper indium gallium (di)selenide (CIGS), a thin film of a semiconductor compound such as a compound with a perovskite structure, a thin film of a semiconductor compound with a kesterite structure, or a thin film of a semiconductor with cadmium telluride (CdTe). CIS is a semiconductor compound containing copper (Cu), indium (In), and selenium (Se). CIGS is a semiconductor compound containing Cu, In, gallium (Ga), and Se. In the example described below, multiple thin-film solar cells 31B are located on a substrate 6.

Figure 7A:
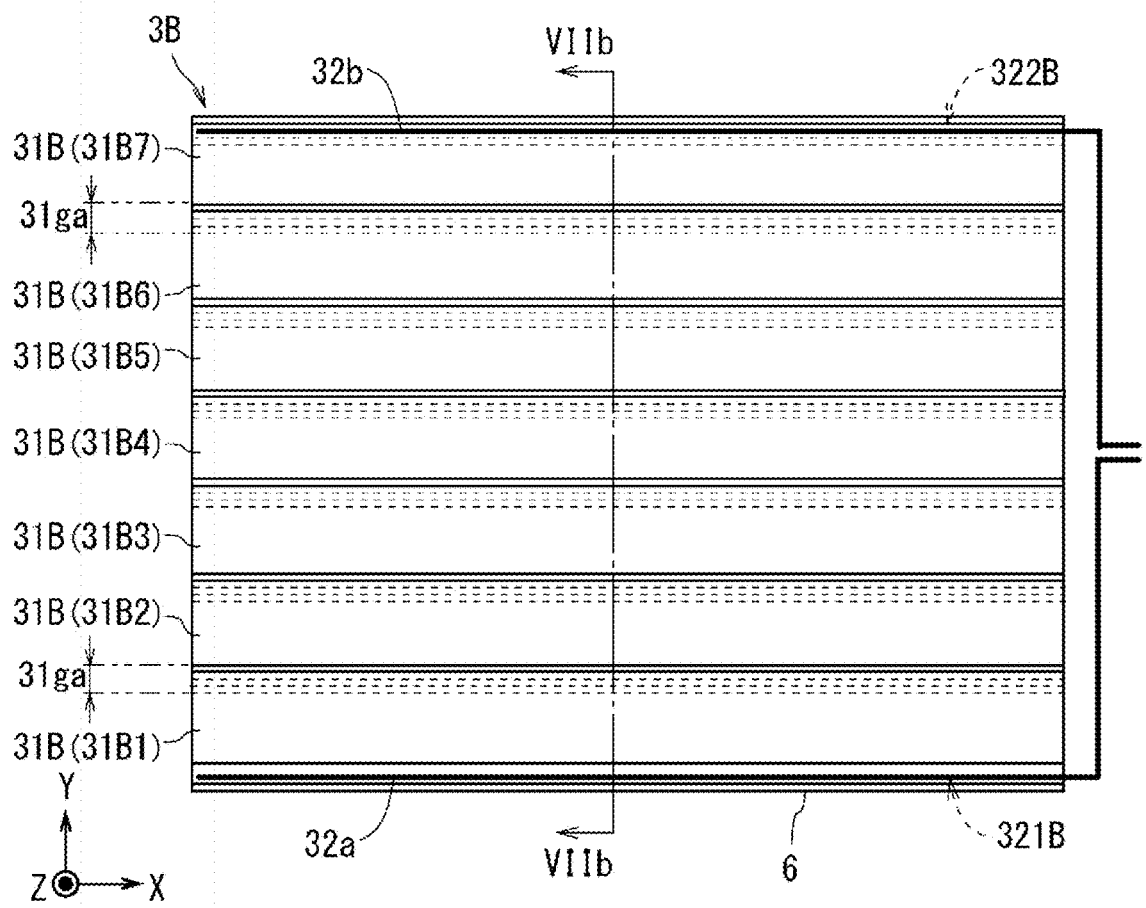
FIG. 7A illustrates a plan view of a solar cell array in the third embodiment, showing an example structure.
Figure 7B:
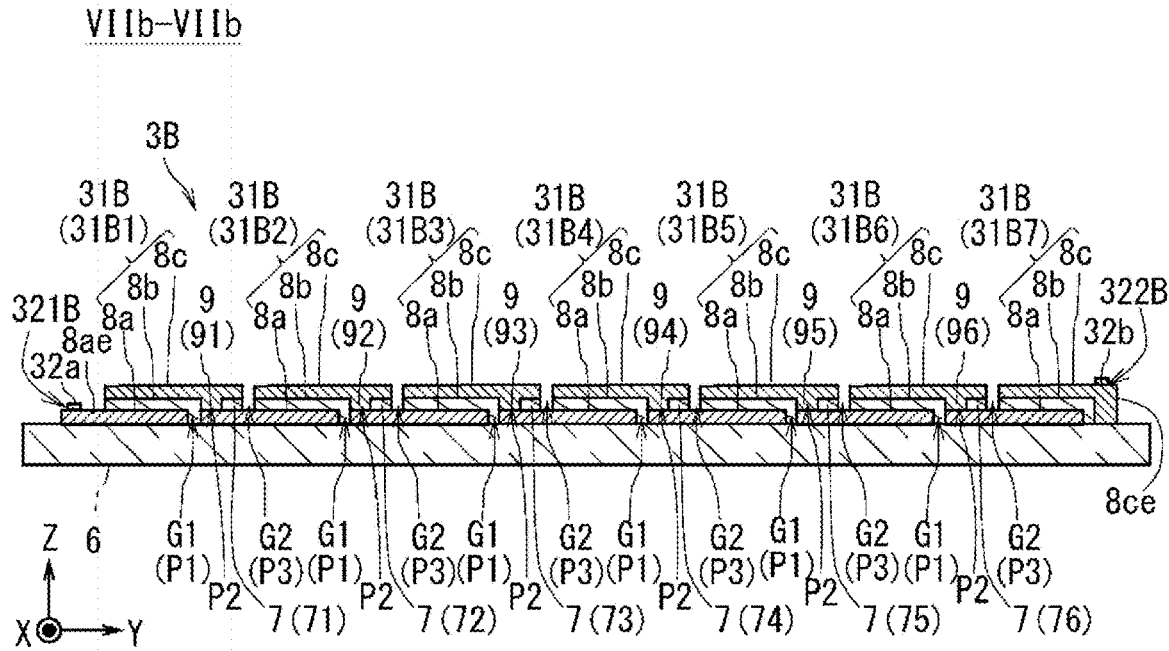
FIG. 7B illustrates an imaginary cross-sectional view of the solar cell array taken along line VIIb-VIIb in FIG. 7A.

As shown in FIGS. 6A to 7B, the solar cell array 3B includes the substrate 6 and a planar array of multiple solar cells 31B on the substrate 6. The planar array herein refers to an array of multiple solar cells 31B arranged side by side along either an imaginary or actual plane. In the example of FIGS. 7A and 7B, the multiple solar cells 31B are arranged side by side on the substrate 6 along the surface of the substrate 6. The substrate 6 may be, for example, a transparent glass substrate with a thickness of about 0.5 to 2 mm.

In this example, the solar cell array 3B includes N solar cells 31B (N is a natural number greater than or equal to 2). The N solar cells 31B may be electrically connected in series. In this case, the output voltage of the solar cell array 3B is higher as the value of N is greater. In the example of FIGS. 7A and 7B, multiple (seven in this example) solar cells 31B are arranged in the +Y direction. Each of the solar cells 31B has, for example, an elongated shape that has the longitudinal direction being the +X direction. With the solar cells 31B having a width of about several millimeters to one centimeter in the +Y direction, the solar cell array 3B can include tens to hundreds of solar cells 31B.

Each of the solar cells 31B includes, for example, a first electrode layer 8a, a semiconductor layer 8b, and a second electrode layer 8c as shown in FIG. 7B. The solar cell array 3B includes, for example, connecting portions 9 and transparent portions 7 between adjacent solar cells 31B as shown in FIG. 7B. In each solar cell 31B, the second electrode layer 8c may be a layer (light transmissive electrode layer) more transmissive to light with a wavelength in a specific range than each semiconductor layer 8b to allow incident light to pass through the second electrode layer 8c. This structure allows, for example, incident light passing through the front protective layer 1 to pass through the second electrode layer 8c and to reach the semiconductor layer 8b. The incident light may be absorbed by the semiconductor layer 8b. The back protective layer 2 may be formed from a light transmissive material, similarly to the material for the front protective layer 1. In this case, the first electrode layer 8a being a light transmissive layer (light transmissive electrode layer) that is more transmissive to light with a wavelength in a specific range than the semiconductor layer 8b allows incident light passing through the back protective layer 2 to pass through the first electrode layer 8a and to reach the semiconductor layer 8b.

Each first electrode layer 8a may be, for example, on the surface of the substrate 6 facing in the +Z direction. Each first electrode layer 8a may be, for example, an electrode (also referred to as a first electrode) that can collect charge generated by photoelectric conversion in response to light reaching the corresponding semiconductor layer 8b. The material for each first electrode layer 8a may be, for example, a transparent conductive oxide (TCO) that is transmissive to light with a wavelength in a specific range. This allows light with a wavelength in a specific range to pass through the back protective layer 2 and the first electrode layer 8a and be incident on the semiconductor layer 8b. Examples of the TCO include indium tin oxide (ITO), fluorine-doped tin oxide (FTO), and zinc oxide (ZnO). The TCO being zinc oxide may contain Al, boron (B), or Ga as appropriate. In the example of FIG. 7B, a planar array of seven first electrode layers 8a in the +Y direction are on the front protective layer 1. The first electrode layer 8a in the m-th solar cell 31Bm (m is a natural number from 1 to 6) and a portion of the first electrode layer 8a in the (m+1)th solar cell 31B(m+1) extending toward the m-th solar cell 31Bm are arranged with a spacing G1 (also referred to as a first spacing) between them. For example, the first electrode layer 8a in the first solar cell 31B1 and a portion of the first electrode layer 8a in the second solar cell 31B2 extending toward the first solar cell 31B1 are arranged with the first spacing G1 between them. Each first spacing G1 has the longitudinal direction being the +X direction. Each first spacing G1 corresponds to a first groove P1 having the bottom on the surface of the substrate 6.

The semiconductor layer 8b is located between the first electrode layer 8a and the second electrode layer 8c. In the structure, the semiconductor layer 8b in the m-th solar cell 31Bm extends to cover an edge of an extension of the first electrode layer 8a in the adjacent (m+1)th solar cell 31B (m+1) extending in the −Y direction. In the structure, the semiconductor layer 8b in the first solar cell 31B1 extends to cover an edge of an extension of the first electrode layer 8a in the adjacent second solar cell 31B2 extending in the −Y direction. Each semiconductor layer 8b may be, for example, a thin film of semiconductor selected from the thin films of semiconductors listed above.

Each second electrode layer 8c is on the corresponding semiconductor layer 8b. Each second electrode layer 8c may be, for example, an electrode (also referred to as a second electrode) that can collect charge generated by photoelectric conversion in response to light reaching the corresponding semiconductor layer 8b. The material for each second electrode layer 8c may be, for example, a TCO that is transmissive to light with a wavelength in a specific range, similarly to the material for each first electrode layer 8a. The structure in the example of FIG. 7B includes a planar array of seven second electrode layers 8c in the +Y direction. A portion of the second electrode layer 8c in the m-th solar cell 31Bm extending toward the (m+1)th solar cell 31B(m+1) and the second electrode layer 8c in the (m+1)th solar cell 31B (m+1) are arranged with a spacing G2 (also referred to as a second spacing) between them. For example, a portion of the second electrode layer 8c in the first solar cell 31B1 extending in the +Y direction and the second electrode layer 8c in the second solar cell 31B2 are arranged with a spacing G2 (second spacing) between them. Each second spacing G2 has the longitudinal direction being the +X direction. Each second spacing G2 corresponds to a third groove P3 having the bottom as a portion of the first electrode layer 8a. The second spacing G2 is at a position shifted in the +Y direction more than the first spacing G1 between the m-th solar cell 31Bm and the (m+1)th solar cell 31B(m+1) that are adjacent to each other in the +Y direction. Thus, for example, an intercellular region 31ga between the m-th solar cell 31Bm and the (m+1)th solar cell 31B(m+1) adjacent to each other in the +Y direction extends from an edge of the first spacing G1 in the −Y direction to an edge of the second spacing G2 in the +Y direction.

Each of the connecting portions 9 electrically connects, for example, two adjacent ones of the multiple solar cells 31B. In the example of FIG. 7B, the m-th connecting portion 9m extends between the corresponding semiconductor layer 8b and the corresponding transparent portion 7. The m-th connecting portion 9m electrically connects the m-th solar cell 31Bm and the (m+1)th solar cell 31(m+1). For example, the first connecting portion 91 electrically connects the first solar cell 31B1 and the second solar cell 31B2. More specifically, the m-th connecting portion 9m electrically connects the second electrode layer 8c in the m-th solar cell 31Bm and the first electrode layer 8a in the (m+1)th solar cell 31B(m+1). For example, the first connecting portion 91 electrically connects the second electrode layer 8c in the first solar cell 31B1 and the first electrode layer 8a in the second solar cell 31B2. The multiple solar cells 31B are thus electrically connected in series. Each connecting portion 9 is inside the corresponding second groove P2 having the end face of the semiconductor layer 8b in the +Y direction and the end face of the transparent portion 7 in the −Y direction as its two sides, and the surface of the first electrode layer 8a in the −Z direction as its bottom. Each second groove P2 has the longitudinal direction being the +X direction. Each second groove P2 is filled with the corresponding connecting portion 9.

The transparent portions 7 are more transmissive to light with a wavelength in a specific range than the semiconductor layers 8b. Each transparent portion 7 is formed by, for example, locally heating a part of the semiconductor layer with the perovskite structure. The m-th transparent portion 7m is located between the m-th connecting portion 9m in the m-th solar cell 31Bm and the (m+1)th solar cell 31B(m+1). For example, the first transparent portion 71 is located between the first connecting portion 91 in the first solar cell 31B1 and the second solar cell 31B2. In the example of FIG. 7B, the m-th transparent portion 7m is located between the m-th connecting portion 9m in the m-th solar cell 31Bm and the third groove P3. The third groove P3 is between the m-th solar cell 31Bm and the (m+1)th solar cell 31B(m+1). For example, the first transparent portion 71 is located between the first connecting portion 91 in the first solar cell 31B1 and the third groove P3 between the first solar cell 31B1 and the second solar cell 31B2. The transparent portions 7 may be formed from, for example, a semiconductor layer that is not transparent.

The first electrode layer 8a in the first solar cell 31B1 includes an extension Bae (also referred to as a first extension) extending more in the −Y direction than the semiconductor layer 8b and the second electrode layer 8c. The semiconductor layer 8b and the second electrode layer 8c in the seventh solar cell 31B7 extend more in the +Y direction than the first electrode layer 8a. The second electrode layer 8c has an extension 8ce (also referred to as a second extension) extending more in the +Y direction than the semiconductor layer 8b. A wire 32a (also referred to as a first output wire) for output with a first polarity is electrically connected to the first extension 8ae. For example, a first output wire 32a may be bonded to the first extension 8ae, which is a part of the electrode included in the first solar cell 31B1. More specifically, for example, a joint 321B (also referred to as a third joint) is located between the first output wire 32a and the first extension 8ae. The joint 321B joins the first output wire 32a and the first extension 8ae. In the example of FIG. 7A, the first output wire 32a extends along the edge of the first solar cell 31B1 in the −Y direction. A wire 32b (also referred to as a second output wire) for output with a second polarity is electrically connected to the second extension 8ce. For example, a second output wire 32b may be bonded to the second extension 8ce, which is a part of the electrode included in the seventh solar cell 31B7. More specifically, for example, a joint 322B (also referred to as a fourth joint) is located between the second output wire 32b and the second extension 8ce. The joint 322B joins the second output wire 32b and the second extension 8ce. In the example of FIG. 7A, the second output wire 32b extends along the edge of the seventh solar cell 31B7 in the +Y direction.

The first output wire 32a and the second output wire 32b may be formed from, for example, conductive metal wires or strips. The material for the third joint 321B and the fourth joint 322B may be, for example, an alloy with a low melting point, such as solder, or a single metal with a low melting point. More specifically, for example, the first output wire 32a and the second output wire 32b may be formed from copper foil with a thickness of about 0.1 to 0.2 mm and a width of about 1 to 2 mm. The entire surfaces of the first output wire 32a and the second output wire 32b may be covered by solder. The first output wire 32a is, for example, electrically connected to the first extension Bae with solder. The second output wire 32b is, for example, electrically connected to the second extension 8ce with solder. In this structure, for example, the third joint 321B may be a solder portion located between the first output wire 32a and the first extension 8ae. For example, the fourth joint 322B may be a solder portion located between the second output wire 32b and the second extension 8ce. The third joint 321B and the fourth joint 322B may also be hereafter simply referred to as joints. The first polarity may be, for example, negative. In this case, the second polarity is positive. The first polarity may be, for example, positive. In this case, the second polarity is negative. The first output wire 32a and the second output wire 32b may be drawn outside through, for example, through-holes in the back protective layer 2.

In the photovoltaic module 100 with this structure according to the third embodiment as well, any free acid occurring in the filler 4 can be dissipated to the external space 200 through the front protective layer 1. The first electrode layers 8a, the second electrode layers 8c, the third joint 321B, and the fourth joint 322B in the thin film solar cells 31B are thus less likely to corrode with the free acid, allowing, for example, the photovoltaic module 100 to have higher long-term reliability.

Figure 8:
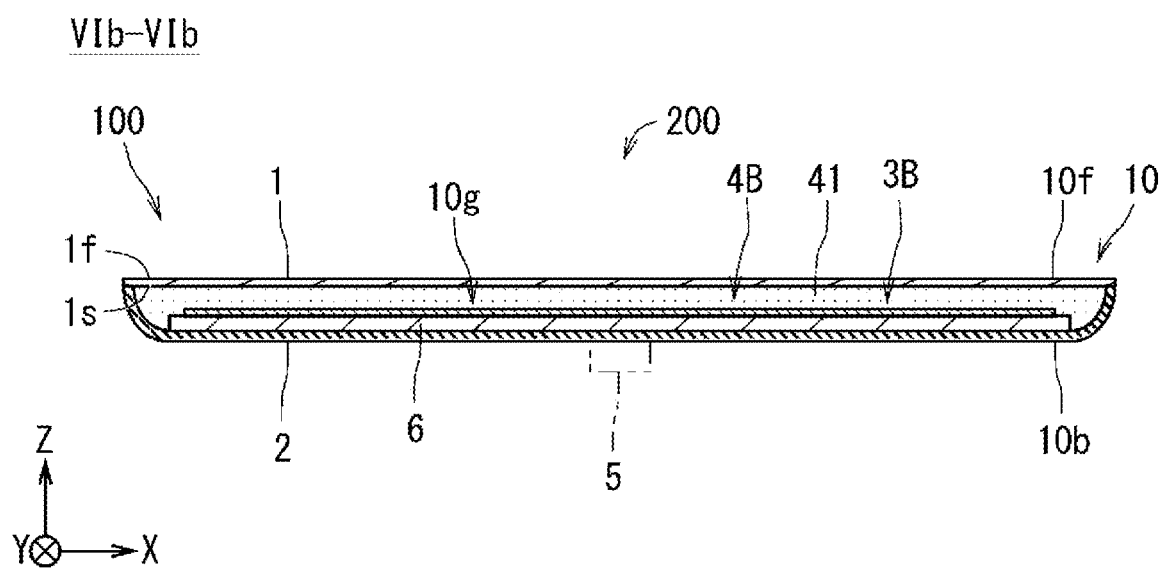
FIG. 8 illustrates an imaginary cross-sectional view of the photovoltaic module according to the third embodiment at a position corresponding to the imaginary cross section in FIG. 6B.

As shown in FIG. 8, for example, the filler 4 may be replaced by a filler 4B including the first filler 41 without including the second filler 42. In this structure, for example, the filler 4B covers the solar cell array 3B including the multiple solar cells 31B between the front protective layer 1 and the solar cell array 3B. Thus, for example, the filler 4B covers the multiple solar cells 31B between the front protective layer 1 and the multiple solar cells 31B.

For example, the substrate 6 in the solar cell array 3B may be the back protective layer 2.

2-3. Fourth Embodiment

Figure 9A:
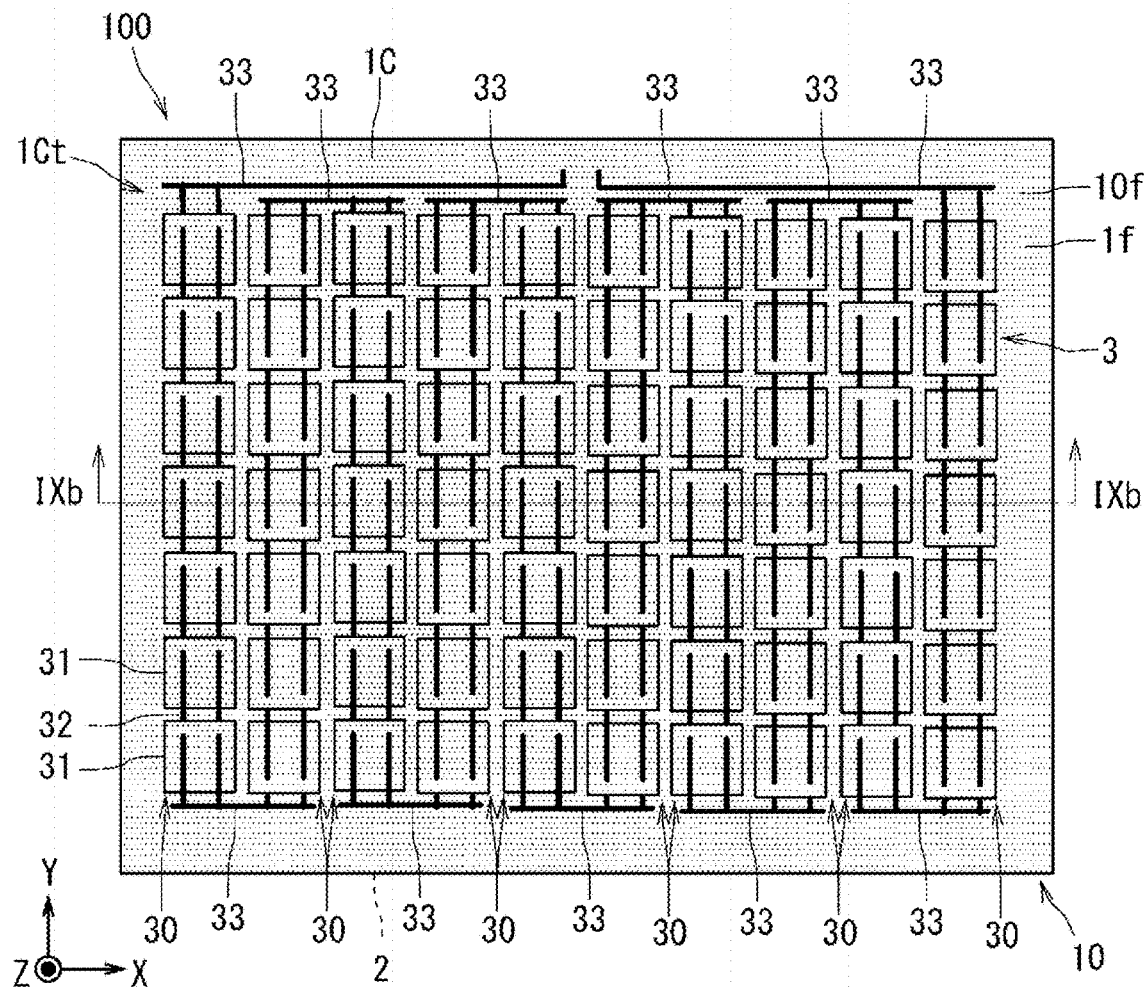
FIG. 9A illustrates a plan view of a photovoltaic module according to a fourth embodiment, showing an example appearance.
Figure 9B:
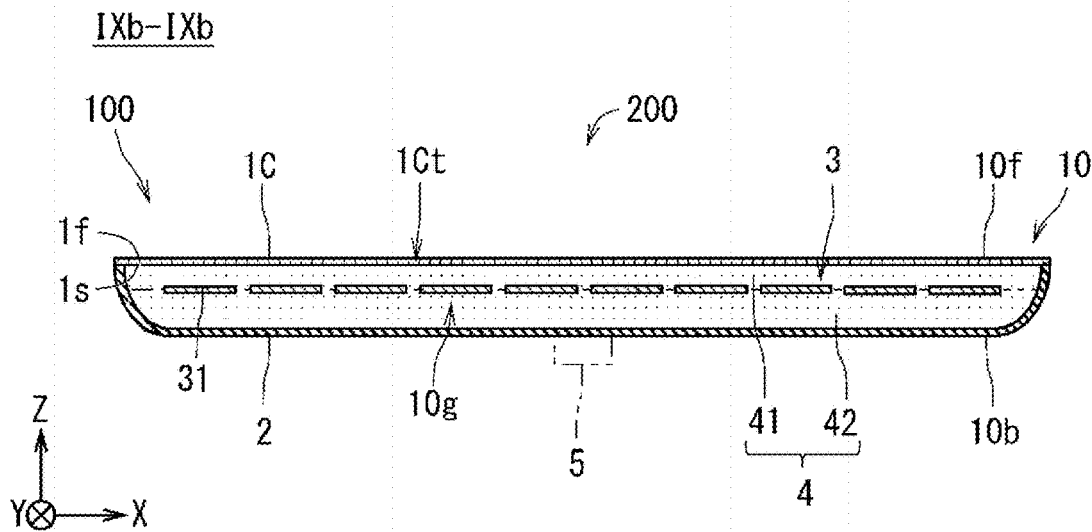
FIG. 9B illustrates an imaginary cross-sectional view of the photovoltaic module taken along line IXb-IXb in FIG. 9A.

In the above first or second embodiment as shown in FIGS. 9A and 9B, for example, the front protective layer 1 may be replaced by a front protective layer 1C with multiple microthrough-holes 1Ct each extending from the first surface 1f to the second surface 1s. The microthrough-holes 1Ct may each have a diameter less than the diameter of a water droplet, such as a raindrop and a drizzle drop, but greater than the diameter of a water particle in water vapor. The microthrough-holes 1Ct may each have, for example, a diameter of about 0.1 to 1 mm. The multiple microthrough-holes 1Ct in the front protective layer 1C can be formed by, for example, micromachining or punching of a weather-resistant resin sheet using a laser. The front protective layer 1C with the multiple microthrough-holes 1Ct is less likely to have lower water resistance and can have higher moisture permeability. When, for example, a free acid such as acetic acid occurs in the filler 4 through, for example, thermal decomposition and hydrolysis, the free acid in the filler 4 can be dissipated to the external space 200 through the microthrough-holes 1Ct in the front protective layer 1C. The electrodes and the joints in the solar cells 31 are thus less likely to corrode with the free acid, allowing, for example, the photovoltaic module 100 to have higher long-term reliability.

The material for the front protective layer 1C may be, for example, a weather-resistant resin similar to the material for the front protective layer 1 in the above first or second embodiment, or any other material that is weather-resistant. In other words, the front protective layer 1C may have, for example, multiple microthrough-holes 1Ct each extending from the first surface 1f to the second surface 1s and may be weather-resistant. In this structure as well, for example, any free acid occurring in the filler 4 can be dissipated to the external space 200 through the microthrough-holes 1Ct in the front protective layer 1C. The electrodes and the joints in the solar cells 31 are thus less likely to corrode with the free acid, allowing, for example, the photovoltaic module 100 to have higher long-term reliability. Another weather-resistance material for the front protective layer 1C may be, for example, glass. Glass has, for example, a lower WVTR than a resin. The multiple microthrough-holes 1Ct in the glass front protective layer 1C can be formed by, for example, micromachining of a glass plate using a laser. The material for the front protective layer 1C may be, for example, Gore-Tex (registered trademark), which is a waterproof and moisture-permeable membrane. A Gore-Tex (registered trademark) membrane contains stretched porous polytetrafluoroethylene (ePTFE) based on polytetrafluoroethylene (PTFE). The microthrough-holes 1Ct may each have, for example, a diameter of about 0.2 μm, which is the average pore diameter of ePTFE. In other words, the microthrough-holes 1Ct may each have, for example, a diameter of about 0.2 μm to 1 mm.

The microthrough-holes 1Ct in the front protective layer 1C may be, for example, located mainly above the first output electrodes 311. The front protective layer 1C with the microthrough-holes 1Ct is less likely to diffuse light from the external space 200 toward portions of the solar cell array 3 other than the first output electrodes 311. Thus, for example, the photovoltaic module 100 is less likely to have lower photoelectric conversion efficiency. In this structure, for example, a free acid more easily diffuses from areas above the first output electrodes 311 in the filler 4 to the external space 200 through the microthrough-holes 1Ct in the front protective layer 1C. The electrodes and the joints in the solar cells 31 are thus less likely to corrode with the free acid, allowing the photovoltaic module 100 to have higher long-term reliability.

2-4. Fifth Embodiment

Figure 10A:
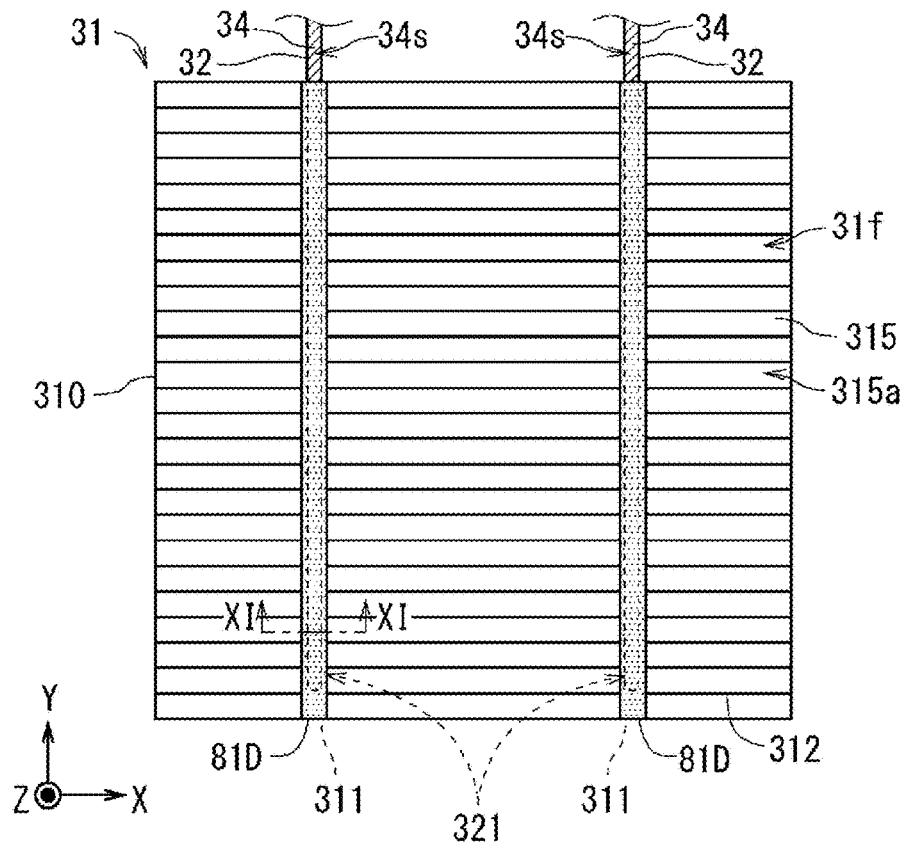
FIG. 10A illustrates a diagram of a solar cell with a first cell surface having first wires and a first protective member in a photovoltaic module according to a fifth embodiment.
Figure 11:
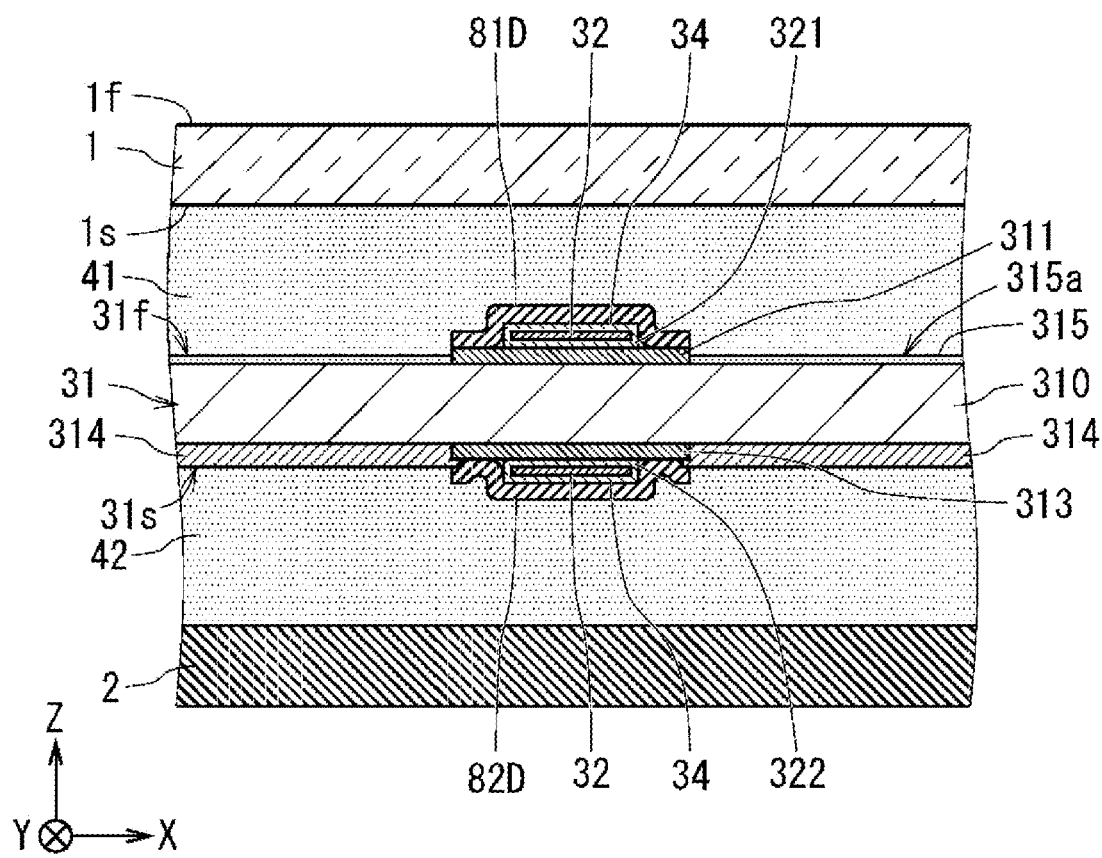
FIG. 11 illustrates an imaginary cross-sectional view of the photovoltaic module according to the fifth embodiment at a position corresponding to the imaginary cross section taken along line XI-XI in FIGS. 10A and 10B.

In the above first, second, and fourth embodiments, the photovoltaic module 100 may include, for example, protective members 81D (also referred to as first protective members) each between the corresponding first joint 321 and the first filler 41 to cover the first joint 321 as shown in FIGS. 10A and 11. In other words, for example, each first protective member 81D is between the first filler 41 and the solar cell 31. The first protective member 81D can protect, for example, the first joint 321. When, for example, a free acid such as acetic acid occurs in the filler 4 through, for example, thermal decomposition and hydrolysis, each first protective member 81D reduces the likelihood that the free acid in the filler 4 reaches the first joint 321. The first joints 321 between the first output electrodes 311 and the first wires 32 are thus less likely to corrode with the free acid, allowing, for example, the photovoltaic module 100 to have higher long-term reliability. More specifically, for example, each first protective member 81D extends from an area between the first filler 41 and the corresponding first wire 32 to an area between the first filler 41 and the corresponding first output electrode 311 to cover the corresponding first joint 321. In the example of FIG. 11, the entire surface of the first wire 32 is covered by a coating 34. The first wire 32 may be, for example, a strip of metal, such as copper foil. The material for the coating 34 may be, for example, a metal with a low melting point, such as solder. A portion of the coating 34 that joins the first output electrode 311 and the first wire 32 serves as the first joint 321. The coating 34 includes a portion between the first wire 32 and the first filler 41. The first protective member 81D is, for example, in contact with the coating 34 and the first output electrode 311. When, for example, the coating 34 is not between the first wire 32 and the first filler 41, the first protective member 81D may be in contact with the first wire 32 and the first output electrode 311.

The first protective member 81D with a smaller area extending beyond an area 315a (also referred to as a light-absorbing area) of the first cell surface 31f without any first output electrode 311 and any first collector electrode 312 reduces the likelihood of less light reaching the semiconductor substrate 310 through the front protective layer 1. Thus, for example, the photovoltaic module 100 is less likely to have lower power generation efficiency. The first protective member 81D covering the first output electrode 311 can protect the first output electrode 311. With the first protective members 81D, for example, any free acid occurring in the filler 4 is less likely to reach the first output electrodes 311. The first output electrodes 311 are thus less likely to corrode with the free acid, allowing the photovoltaic module 100 to have higher long-term reliability.

Figure 10B:
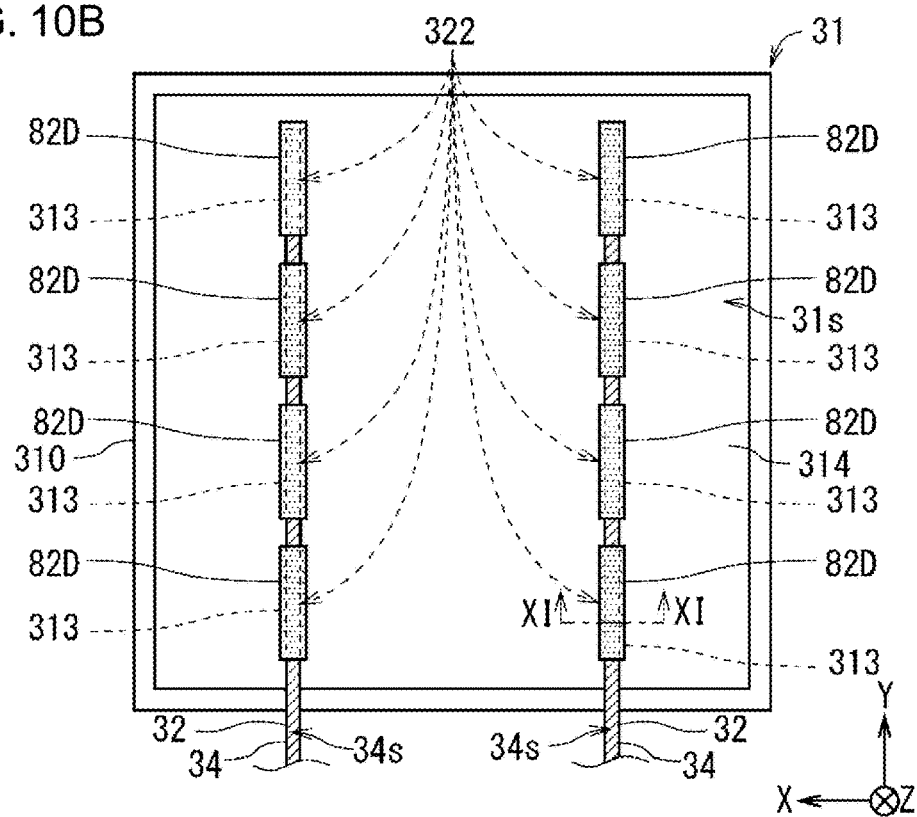
FIG. 10B illustrates a diagram of the solar cell with a second cell surface having first wires and a second protective member in the photovoltaic module according to the fifth embodiment.

The photovoltaic module 100 may include, for example, protective members 82D (also referred to as second protective members) each between the second joint 322 and the second filler 42 to cover the second joint 322 as shown in FIGS. 10B and 11. In other words, for example, each second protective member 82D is between the second filler 42 and the solar cell 31. The second protective member 82D can protect, for example, the second joint 322. When, for example, a free acid such as acetic acid occurs in the filler 4 through, for example, thermal decomposition and hydrolysis, each second protective member 82D reduces the likelihood that the free acid in the filler 4 reaches the second joint 322. The second joints 322 between the second output electrodes 313 and the first wires 32 are thus less likely to corrode with the free acid, allowing, for example, the photovoltaic module 100 to have higher long-term reliability. More specifically, for example, each second protective member 82D extends from an area between the second filler 42 and the corresponding first wire 32 to an area between the second filler 42 and the corresponding second output electrode 313 to cover the corresponding second joint 322. In the example of FIG. 11, the coating 34 coating the entire surface of the first wire 32 may have a portion that joins the second output electrode 313 and the first wire 32 to serve as the second joint 322. The coating 34 includes a portion between the first wire 32 and the second filler 42. The second protective member 82D is, for example, in contact with the coating 34 and the second output electrode 313. When, for example, the coating 34 is not between the first wire 32 and the second filler 42, the second protective member 82D may be in contact with the first wire 32 and the second output electrode 313.

The second protective member 82D covering the second output electrode 313 can protect the second output electrode 313. With the second protective members 82D, for example, any free acid occurring in the filler 4 is less likely to reach the second output electrodes 313. The second output electrodes 313 are thus less likely to corrode with the free acid, allowing the photovoltaic module 100 to have higher long-term reliability.

The first protective members 81D and the second protective members 82D may be, for example, fluorine tape. For example, fluorine tape has high weather resistance. Thus, the first protective members 81D and the second protective members 82D can be more durable, allowing, for example, the photovoltaic module 100 to have higher long-term reliability. The fluorine tape may include, for example, a strip of base material containing a fluorine resin (also referred to as a fluorine-based material) and an adhesive on the surface of the base material. Examples of the fluorine resin include films of fluorine resins such as PTFE, ETFE, ECTFE, or FEP, or films impregnated with PTFE, ETFE, ECTFE, or FEP. The adhesive may be, for example, an acrylic or silicone adhesive. The first protective members 81D and the second protective members 82D may be, for example, weather-resistant tape other than fluorine tape. The fluorine-based material may be replaced by, for example, a base material of polyimide such as Kapton (registered trademark), PET, acrylic, polycarbonate, cellophane, or vinyl chloride. The first protective members 81D and the second protective members 82D each having an adhesive may be bonded to the intended positions of the solar cell array 3 before the laminate 10s to undergo the lamination process is formed during manufacture of the photovoltaic module 100. The first protective members 81D and the second protective members 82D are less likely to be misaligned when the solar cell array 3 is moved before formation of the laminate 10s or during the lamination process. The first protective members 81D and the second protective members 82D can more reliably protect the first joints 321 and the second joints 322. For example, the first protective members 81D and the second protective members 82D each may not have an adhesive. The first protective members 81D and the second protective members 82D may be arranged at the intended positions of the solar cell array 3 when the laminate 10s undergoes the lamination process during manufacture of the photovoltaic module 100.

Each first protective member 81D may be located between the first joint 321 and the first filler 41 to cover at least a part of the first joint 321. This structure also reduces, for example, the likelihood that any free acid occurring in the filler 4 reaches the first joints 321. The first joints 321 between the first output electrodes 311 and the first wires 32 are thus less likely to corrode with the free acid, allowing, for example, the photovoltaic module 100 to have higher long-term reliability. Each second protective member 82D may be located between the second joint 322 and the second filler 42 to cover at least a part of the second joint 322. This structure also reduces, for example, the likelihood that any free acid occurring in the filler 4 reaches the second joints 322. The second joints 322 between the second output electrodes 313 and the first wires 32 in the solar cells 31 are thus less likely to corrode with the free acid, allowing, for example, the photovoltaic module 100 to have higher long-term reliability.

Figure 12A:
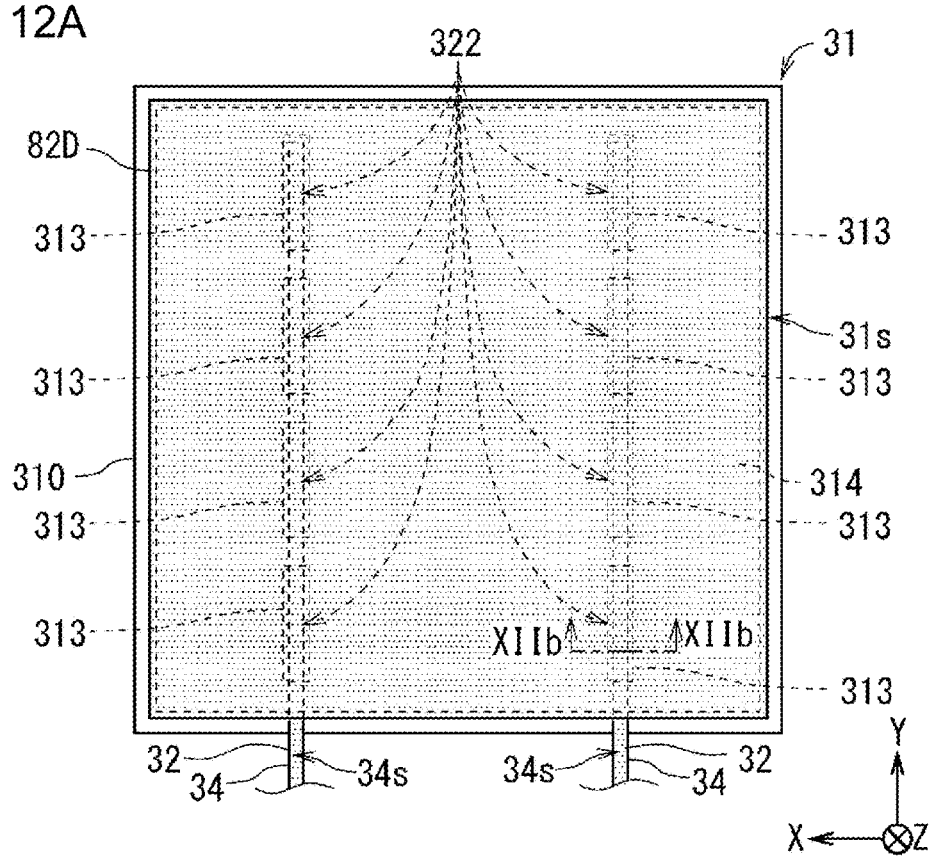
FIG. 12A illustrates a diagram of a solar cell with a second cell surface having first wires and a second protective member in a photovoltaic module according to a modification of the fifth embodiment.
Figure 12B:
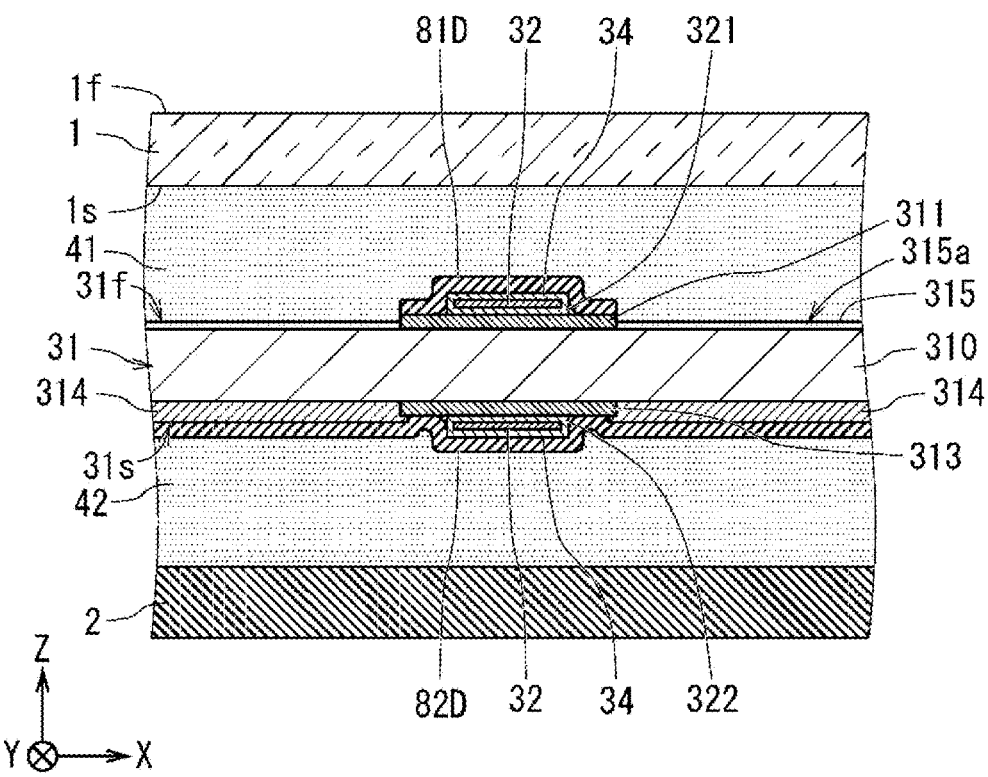
FIG. 12B illustrates an imaginary cross-sectional view of the photovoltaic module according to the modification of the fifth embodiment at a position corresponding to the imaginary cross section taken along line XIIb-XIIb in FIG. 12A.

As shown in FIGS. 12A and 12B, for example, a second protective member 82D may be located between the second collector electrode 314 and the second filler 42. The second protective member 82D can protect, for example, the second collector electrode 314. When, for example, a free acid such as acetic acid occurs in the filler 4 through, for example, thermal decomposition and hydrolysis, the second protective member 82D reduces the likelihood that the free acid in the filler 4 reaches the second collector electrode 314. The second collector electrode 314 is thus less likely to corrode with the free acid, allowing, for example, the photovoltaic module 100 to have higher long-term reliability. The second protective member 82D located between the second collector electrode 314 and the second filler 42 to cover the second collector electrode 314 can protect the second collector electrode 314. With the second protective member 82D, for example, any free acid occurring in the filler 4 is further less likely to reach the second collector electrode 314. The second collector electrode 314 is thus less likely to corrode with the free acid, allowing the photovoltaic module 100 to have higher long-term reliability.

For example, the first joints 321 and the second joints 322 each may have a surface portion 34s containing at least one material selected from tin oxide, lead oxide, tin sulfide, and lead sulfide. An outer periphery of the coating 34 surrounding the first wire 32 may be the surface portion 34s containing at least one material selected from tin oxide, lead oxide, tin sulfide, and lead sulfide. In this structure, for example, the first joints 321 and the second joints 322 are less likely to react with a free acid such as acetic acid and moisture. The first joints 321 and the second joints 322 are thus less likely to corrode with the free acid, allowing, for example, the photovoltaic module 100 to have higher long-term reliability. The coating 34 surrounding each first wire 32 may be solder. When, for example, solder containing tin (Sn) is used, the solar cell array 3 may be heated in a furnace in an atmosphere of oxygen before the laminate 10s for the lamination process is formed. This causes the surface portion 34s of each coating 34 to contain tin oxide. When solder containing lead (Pb) is used, the solar cell array 3 may be heated in a furnace with an atmosphere of oxygen before the laminate 10s for the lamination process is formed. This causes the surface portion 34s of each coating 34 to contain lead oxide. When, for example, solder containing tin (Sn) is used, the solar cell array 3 may be heated in a furnace with an atmosphere of hydrogen sulfide before the laminate 10s for the lamination process is formed. This causes the surface portion 34s of each coating 34 to contain tin sulfide. When, for example, solder containing lead (Pb) is used, the solar cell array 3 may be heated in a furnace with an atmosphere of hydrogen sulfide before the laminate 10s for the lamination process is formed. This causes the surface portion 34s of each coating 34 to contain lead sulfide.

When, for example, the photovoltaic module 100 is viewed from the front protective layer 1, the surface of each first protective member 81D facing the front protective layer 1 may have the color of a hue closer to the light-absorbing area 315a in the solar cell 31 than the surface of the first wire 32 or the coating 34. In this structure, for example, the first wire 32 and the coating 34 located behind each first protective member 81D can be less noticeable when the photovoltaic module 100 is viewed from the front protective layer 1. The photovoltaic module 100 appears less noticeable in its installation area. The installation area of the photovoltaic module 100 allows for an improved design. The surface of each first protective member 81D can directly have the color of the base material for the first protective member 81D or the color of a coloring material such as pigment applied onto the base material. When, for example, the photovoltaic module 100 is viewed from the front protective layer 1, the surface of each first protective member 81D facing the front protective layer 1 may have a similar color to the color of the light-absorbing area 315a. In this structure, the first wire 32 and the coating 34 located behind the first protective member 81D can be less noticeable when the photovoltaic module 100 is viewed from the front protective layer 1. The similar color herein refers to, for example, the color of the same hue but different in brightness or chroma, the color of the same hue but different in tone, and one of adjacent colors in a hue ring for the same tone. Examples of the hue ring include the hue ring of the Munsell color system (also referred to as the Munsell hue ring), the hue ring of the Ostwald color system (also referred to as the Ostwald hue ring), and the hue ring of the Practical Color Coordinate System (PCCS). The hue ring may be a ring of 24 hue colors such as the Ostwald hue ring or the PCCS hue ring, or a ring of 20 hue colors such as the Munsell hue ring. When, for example, the photovoltaic module 100 is viewed from the front protective layer 1, the surface of each first protective member 81D facing the front protective layer 1 may have substantially the same color as the light-absorbing area 315a. In this structure, the first wire 32 and the coating 34 located behind the first protective member 81D can further be less noticeable when the photovoltaic module 100 is viewed from the front protective layer 1.

In this structure, for example, the surface portion 34s of the coating 34 between the first wire 32 and the first filler 41 to cover the first wire 32 may include at least one of tin sulfide or lead sulfide. For example, tin sulfide and lead sulfide are black. When, for example, the photovoltaic module 100 is viewed from the front protective layer 1, the color of the light-absorbing area 315a in the solar cell 31 may appear black. In this structure, although each first wire 32 is partially uncovered by the first protective member 81D, the first wire 32 can be less noticeable when the photovoltaic module 100 is viewed from the front protective layer 1. The color of the back protective layer 2 may appear black. In this structure, each first wire 32 between adjacent solar cells 31 can be less noticeable when the photovoltaic module 100 is viewed from the front protective layer 1. With the first wires 32 being less noticeable, the photovoltaic module 100 appears less noticeable in its installation area. The installation area of the photovoltaic module 100 allows for an improved design. The surface portion 34s of each coating 34 may contain tin sulfide between the first wire 32 and the first filler 41. In this structure, for example, the coating 34 containing tin sulfide, which is difficult to dissolve in water, can have higher durability. In this structure, for example, the first wires 32 can be less noticeable over a long period of time when the photovoltaic module 100 is viewed from the front protective layer 1. The installation area of the photovoltaic module 100 allows for an improved design over a long period of time.

2-5. Sixth Embodiment

Figure 13A:
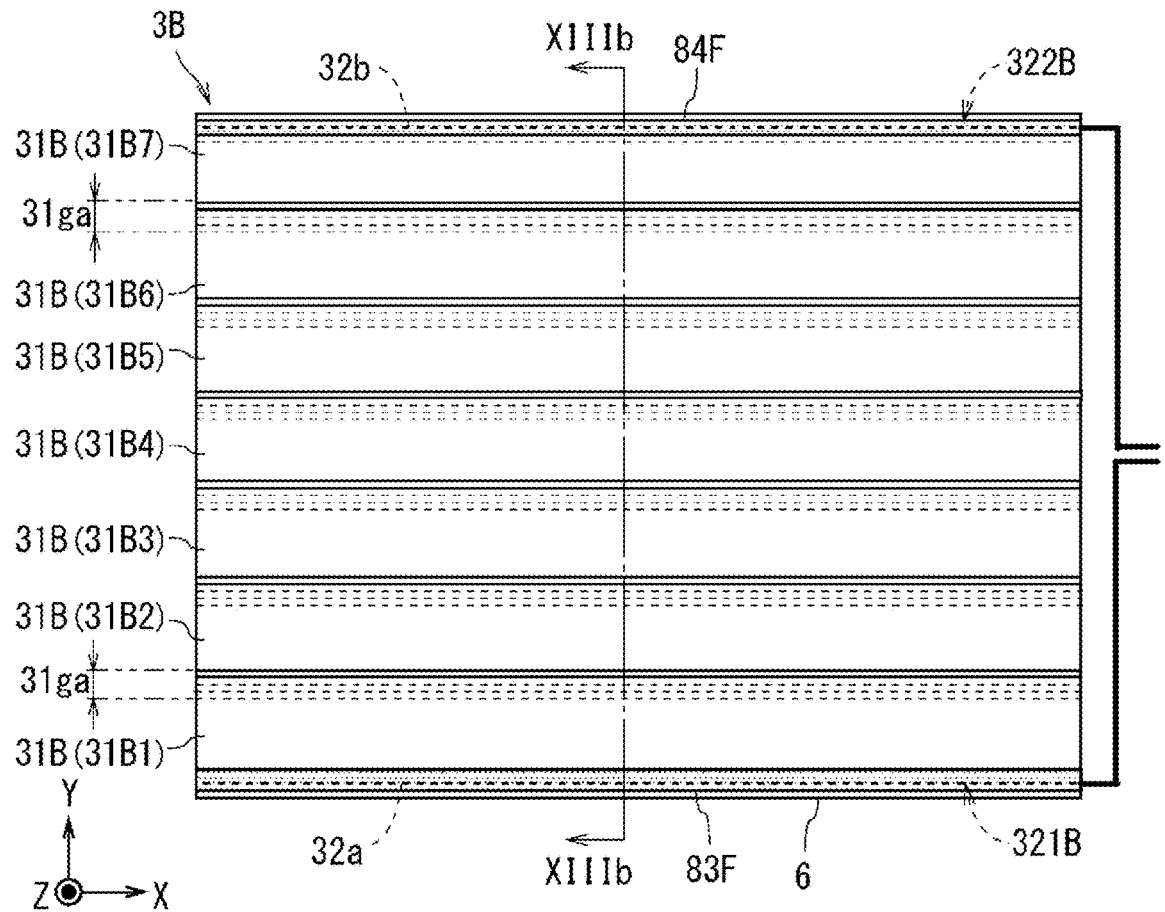
FIG. 13A illustrates a diagram of a solar cell array including solar cells with first output wires, a third protective member, second output wires, and a fourth protective member on electrodes in a photovoltaic module according to a sixth embodiment.
Figure 13B:
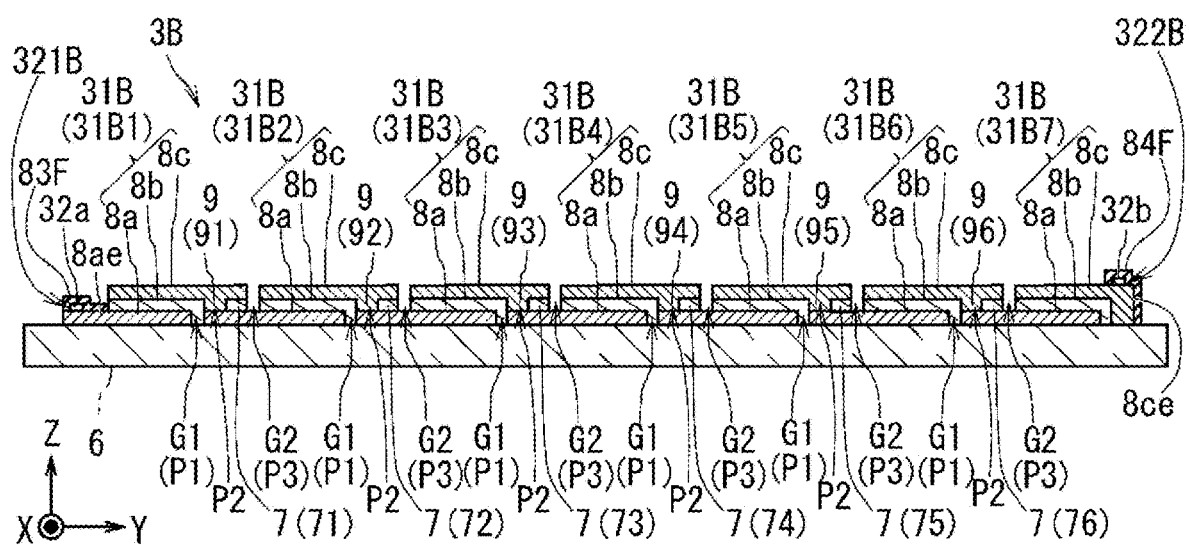
FIG. 13B illustrates an imaginary cross-sectional view taken along line XIIIb-XIIIb in FIG. 13A showing the solar cell array, the first output wires, the third protective member, the second output wires, and the fourth protective member.

In the above third embodiment, a protective member 83F (also referred to as a third protective member) may be located to cover the third joint 321B as shown in, for example, FIGS. 13A and 13B. In other words, the photovoltaic module 100 may include, for example, the third protective member 83F between the third joint 321B and the first filler 41 to cover the third joint 321B. In this structure, for example, the third protective member 83F is located between the first extension Bae of the first electrode layer 8a and the first filler 41 in the first solar cell 31B1. In this structure, for example, a protective member 84F (also referred to as a fourth protective member) may be located to cover the fourth joint 322B. In other words, the photovoltaic module 100 may include, for example, the fourth protective member 84F between the fourth joint 322B and the first filler 41 to cover the fourth joint 322B. In this structure, for example, the fourth protective member 84F is located between the second extension 8ce of the second electrode layer 8c and the first filler 41 in the seventh solar cell 31B7.

For example, the third protective member 83F covering the third joint 321B can protect the third joint 321B. More specifically, for example, the third protective member 83F extends from an area between the first filler 41 and the first output wire 32a to an area between the first filler 41 and the first extension Bae of the first electrode layer 8a to cover the third joint 321B. When, for example, a free acid such as acetic acid occurs in the filler 4 through, for example, thermal decomposition and hydrolysis, the third protective member 83F reduces the likelihood that the free acid in the filler 4 reaches the third joint 321B. The third joint 321B between the first extension Bae of the first electrode layer 8a and the first output wire 32a is thus less likely to corrode with the free acid, allowing the photovoltaic module 100 to have higher long-term reliability.

For example, the fourth protective member 84F covering the fourth joint 322B can protect the fourth joint 322B. More specifically, for example, the fourth protective member 84F extends from an area between the first filler 41 and the second output wire 32b to an area between the first filler 41 and the second extension 8ce of the second electrode layer 8c to cover the fourth joint 322B. When, for example, a free acid such as acetic acid occurs in the filler 4 through, for example, thermal decomposition and hydrolysis, the fourth protective member 84F reduces the likelihood that the free acid in the filler 4 reaches the fourth joint 322B. The fourth joint 322B between the second extension 8ce of the second electrode layer 8c and the second output wire 32b is thus less likely to corrode with the free acid, allowing the photovoltaic module 100 to have higher long-term reliability.

The third protective member 83F and the fourth protective member 84F may have the same structure as the first protective member 81D and the second protective member 82D in the above fifth embodiment. Similarly to each first wire 32 in the above fifth embodiment, the entire surface of the first output wire 32a may be covered by the same coating as the coating 34 described above. In this structure, a portion joining the first extension Bae and the first output wire 32a in the coating serves as the third joint 321B. In this structure, for example, the third protective member 83F is in contact with the coating and the first extension Bae of the first output wire 32a. When, for example, the coating is not between the first output wire 32a and the first filler 41, the third protective member 83F may be in contact with the first output wire 32a and the first extension 8ae. Similarly to each first wire 32 in the above fifth embodiment, the entire surface of the second output wire 32b may be covered by the same coating as the coating 34 described above. In this structure, a portion joining the second extension 8ce and the second output wire 32b in the coating serves as the fourth joint 322B. In this structure, for example, the fourth protective member 84F is in contact with the coating and the second extension 8ce of the second output wire 32b. When, for example, the coating is not between the second output wire 32b and the first filler 41, the fourth protective member 84F may be in contact with the second output wire 32b and the second extension 8ce.

The third protective member 83F may be between the third joint 321B and the first filler 41 to cover at least a part of the third joint 321B. In this structure, any free acid occurring in the filler 4 is less likely to reach the third joint 321B. The third joint 321B between the first extension Bae and the first output wire 32a is thus less likely to corrode with the free acid, allowing the photovoltaic module 100 to have higher long-term reliability. The fourth protective member 84F may be between the fourth joint 322B and the first filler 41 to cover at least a part of the fourth joint 322B. In this structure, any free acid occurring in the filler 4 is less likely to reach the fourth joint 322B. The fourth joint 322B between the second extension 8ce and the second output wire 32b is thus less likely to corrode with the free acid, allowing the photovoltaic module 100 to have higher long-term reliability.

For example, the third joint 321B and the fourth joint 322B each may have a surface portion similar to the above surface portion 34s containing at least one material selected from tin oxide, lead oxide, tin sulfide, and lead sulfide, similarly to the first joint 321 and the second joint 322 in the above fifth embodiment. An outer periphery of the coating surrounding each of the first output wire 32a and the second output wire 32b may be the surface portion containing at least one material selected from tin oxide, lead oxide, tin sulfide, and lead sulfide. In this structure, for example, the third joint 321B and the fourth joint 322B are less likely to react with a free acid such as acetic acid and moisture and are less likely to corrode, allowing, for example, the photovoltaic module 100 to have higher long-term reliability. The coating surrounding the first output wire 32a and the second output wire 32b may be solder. When, for example, solder containing tin is used, the solar cell array 3B may be heated in a furnace in an atmosphere of oxygen before the laminate for the lamination process is formed. This causes the surface portion of each coating to contain tin oxide. When, for example, solder containing lead is used, the solar cell array 3B may be heated in a furnace with an atmosphere of oxygen before the laminate for the lamination process is formed. This causes the surface portion of each coating to contain lead oxide. When, for example, solder containing tin is used, the solar cell array 3B may be heated in a furnace with an atmosphere of hydrogen sulfide before the laminate for the lamination process is formed. This causes the surface portion of each coating to contain tin sulfide. When, for example, solder containing lead is used, the solar cell array 3B may be heated in a furnace with an atmosphere of hydrogen sulfide before the laminate for the lamination process is formed. This causes the surface portion of each coating to contain lead sulfide.

When, for example, the photovoltaic module 100 is viewed from the front protective layer 1, the surface of the third protective member 83F facing the front protective layer 1 may have the color of a hue closer to an area of the semiconductor layer 8b adjacent to the front protective layer 1 in each solar cell 31B (also referred to as a light-absorbing area) than the surface of the first output wire 32a or the coating over the first output wire 32a. When, for example, the photovoltaic module 100 is viewed from the front protective layer 1, the surface of the fourth protective member 84F facing the front protective layer 1 may have the color of a hue closer to an area of the semiconductor layer 8b adjacent to the front protective layer 1 in each solar cell 31B (also referred to as a light-absorbing area) than the surface of the second output wire 32b or the coating over the second output wire 32b. The light-absorbing area may include an anti-reflection film of, for example, silicon nitride on the second electrode layer 8c. In this structure, for example, the first output wire 32a and the second output wire 32b can be less noticeable when, for example, the photovoltaic module 100 is viewed from the front protective layer 1. The photovoltaic module 100 appears less noticeable in its installation area. The installation area of the photovoltaic module 100 allows for an improved design. The surfaces of the third protective member 83F and the fourth protective member 84F can directly have the color of the base material for the third protective member 83F and the fourth protective member 84F, or the color of a coloring material such as pigment applied onto the base material. When, for example, the photovoltaic module 100 is viewed from the front protective layer 1, the surfaces of the third protective member 83F and the fourth protective member 84F facing the front protective layer 1 may have a similar color to the color of the light-absorbing area. In this structure, the first output wire 32a and the second output wire 32b can further be less noticeable when, for example, the photovoltaic module 100 is viewed from the front protective layer 1. When, for example, the photovoltaic module 100 is viewed from the front protective layer 1, the surfaces of the third protective member 83F and the fourth protective member 84F facing the front protective layer 1 may have substantially the same color as the light-absorbing area. In this structure, the first output wire 32a and the second output wire 32b can further be less noticeable when, for example, the photovoltaic module 100 is viewed from the front protective layer 1.

The surface portion of the coating between the first and second output wires 32a and 32b and the first filler 41 to cover the first and second output wires 32a and 32b may include at least one of tin sulfide or lead sulfide. For example, tin sulfide and lead sulfide are black. When, for example, the photovoltaic module 100 is viewed from the front protective layer 1, the color of the light-absorbing area in each solar cell 31B may appear black. In this structure, although the first output wire 32a and the second output wire 32b are partially uncovered by the third protective member 83F and the fourth protective member 84F, the first output wire 32a and the second output wire 32b can be less noticeable when the photovoltaic module 100 is viewed from the front protective layer 1. The color of the back protective layer 2 may be black. In this structure, the first output wire 32a and the second output wire 32b around the solar cell array 3B can be less noticeable when the photovoltaic module 100 is viewed from the front protective layer 1. With the first output wire 32a and the second output wire 32b being less noticeable for example, the photovoltaic module 100 appears less noticeable in its installation area. The installation area of the photovoltaic module 100 allows for an improved design.

The surface portion of the coating covering the first output wire 32a may contain tin sulfide between the first output wire 32a and the first filler 41. In this structure, for example, the coating containing tin sulfide, which is difficult to dissolve in water, can have higher durability. In this structure, for example, the first output wire 32a can be less noticeable over a long period of time when the photovoltaic module 100 is viewed from the front protective layer 1. The installation area of the photovoltaic module 100 allows for an improved design over a long period of time. The surface portion of the coating covering the second output wire 32b may contain tin sulfide between the second output wire 32b and the first filler 41. In this structure, for example, the coating containing tin sulfide, which is difficult to dissolve in water, can have higher durability. In this structure, for example, the second output wire 32b can be less noticeable over a long period of time when the photovoltaic module 100 is viewed from the front protective layer 1. The installation area of the photovoltaic module 100 allows for an improved design over a long period of time.

Figure 14A:
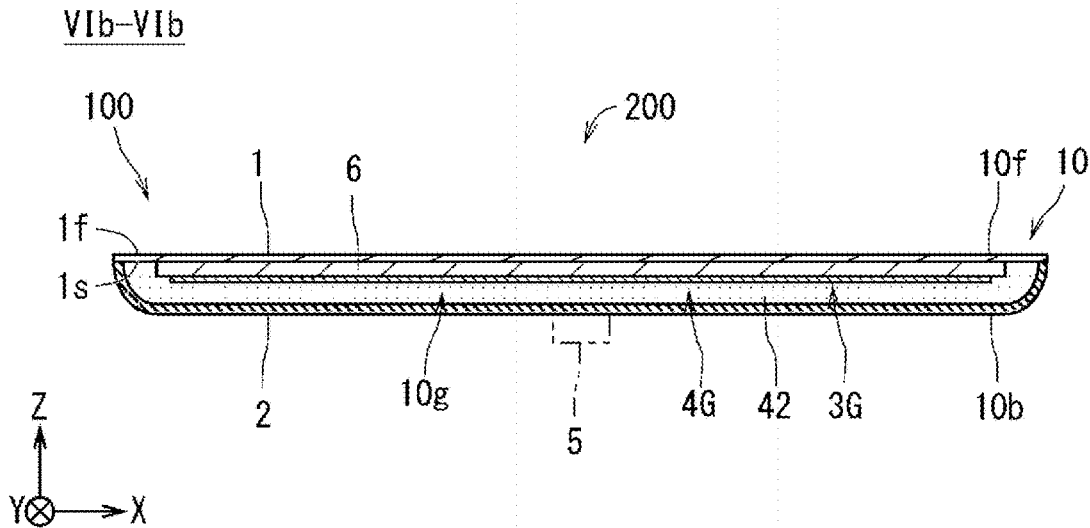
FIG. 14A illustrates an imaginary cross-sectional view of a photovoltaic module according to a modification of the sixth embodiment at a position corresponding to the imaginary cross section in FIG. 6B.
Figure 14B:
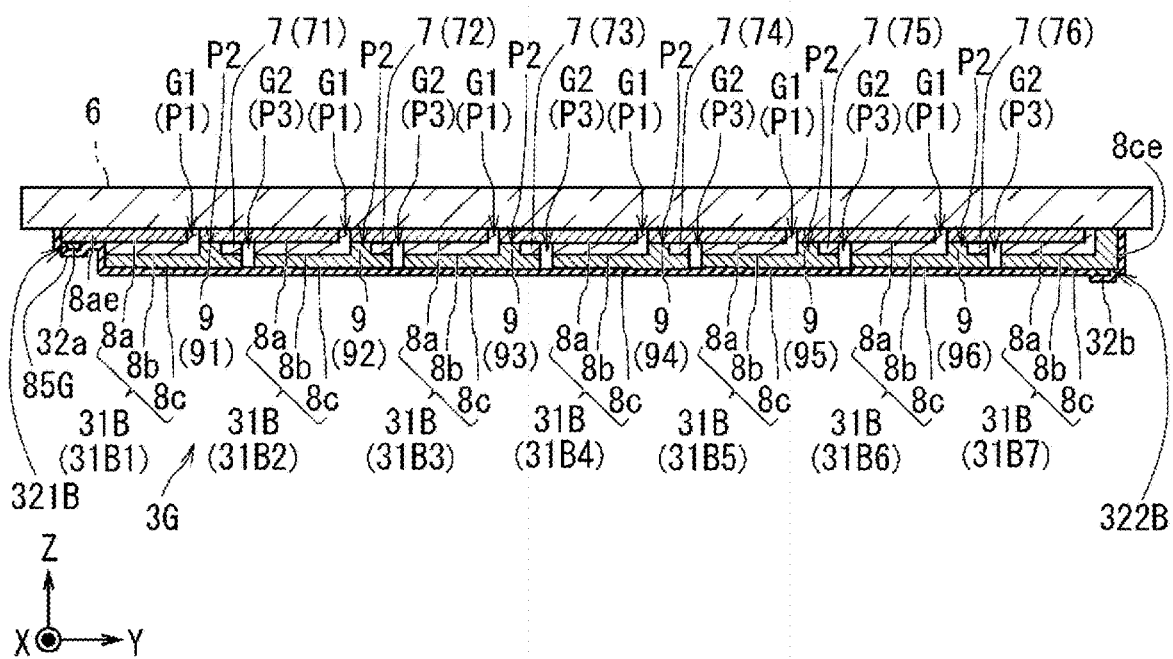
FIG. 14B illustrates an imaginary cross-sectional view of the photovoltaic module according to the modification of the sixth embodiment at a position corresponding to the imaginary cross section in FIG. 13B showing a solar cell array, first output wires, second output wires, and a fifth protective member.

As shown in FIGS. 14A and 14B, for example, the solar cell array 3B may be replaced by a solar cell array 3G with the top and bottom reversed from the solar cell array 3B. As shown in FIG. 14A, for example, the filler 4 may be replaced by a filler 4G including the second filler 42 without including the first filler 41. In this structure, for example, the filler 4G covers the solar cell array 3G including multiple solar cells 31B between the back protective layer 2 and the solar cell array 3G. Thus, for example, the filler 4G covers the multiple solar cells 31B between the back protective layer 2 and the multiple solar cells 31B. As shown in FIGS. 14A and 14B, for example, a fifth protective member 85G may be located between the second electrode layer 8c in each solar cell 31B and the second filler 42. In the example of FIG.

14B, the third protective member 83F and the fourth protective member 84F may be replaced by the fifth protective member 85G. More specifically, the fifth protective member 85G covers the third joint 321B, the fourth joint 322B, and each second electrode layer 8c. The fifth protective member 85G can protect, for example, each second electrode layer 8c. When, for example, a free acid such as acetic acid occurs in the filler 4G through, for example, thermal decomposition and hydrolysis, the fifth protective member 85G reduces the likelihood that the free acid in the filler 4G reaches each second electrode layer 8c. Each second electrode layer 8c is thus less likely to corrode with the free acid, allowing, for example, the photovoltaic module 100 to have higher long-term reliability. The fifth protective member 85G may have the same structure as the first protective member 81D, the second protective member 82D, the third protective member 83F, and the fourth protective member 84F described above.

3. Others

In the above first to sixth embodiments, for example, the front protective layer 1 formed from ECTFE as a fluorine resin easily allows the photovoltaic module 100 to have higher long-term reliability. This is because the WVTR of ECTFE is known to be between the WVTR of FEP and the WVTR of ETFE, and also ECTFE is less expensive than ETFE.

In the above fourth embodiment, for example, the solar cell array 3 may be replaced by a solar cell array according to another embodiment, such as the solar cell arrays 3B and 3G in the above third and sixth embodiments.

In the above fifth embodiment, for example, the photovoltaic module 100 includes the front protective layer 1 formed from a member without moisture permeability, such as a glass plate, but includes the first protective member 81D and the second protective member 82D and thus can have higher long-term reliability. For example, either the first protective member 81D or the second protective member 82D may be used.

In the above sixth embodiment, for example, the photovoltaic module 100 includes the front protective layer 1 formed from a member without moisture permeability, such as a glass plate, but includes the third protective member 83F and the fourth protective member 84F or the fifth protective member 85G and thus can have higher long-term reliability. For example, either the third protective member 83F or the fourth protective member 84F may be used.

The components described in the above embodiments and modifications may be entirely or partially combined as appropriate unless any contradiction arises.

The invention claimed is:

1. A photovoltaic module, comprising:
a front protective layer being transmissive to light, the front protective layer having a first surface and a second surface opposite to the first surface;
a back protective layer facing the second surface;
a plurality of solar cells between the second surface and the back protective layer; and
a filler between the front protective layer and the plurality of solar cells, the filler covering the plurality of solar cells,
wherein
the filler comprises a material with a chemical structure to generate a free acid,
the front protective layer comprises a weather-resistance resin,
at least a part of the first surface is exposed to a space external to the photovoltaic module, and
the front protective layer has a plurality of microthroughholes each extending from the first surface to the second surface.

2. The photovoltaic module according to claim 1, wherein the front protective layer comprises a fluorine resin.

3. The photovoltaic module according to claim 2, wherein the fluorine resin includes at least one selected from the group consisting of fluorinated ethylene propylene, ethylene tetrafluoroethylene, and ethylene chlorotrifluoroethylene.

4. The photovoltaic module according to claim 1, further comprising:
a protective film located on a part of the first surface to protect the first surface.

5. A photovoltaic module, comprising:
a front protective layer being transmissive to light, the front protective layer having a first surface and a second surface opposite to the first surface;
a back protective layer facing the second surface;
a plurality of solar cells between the second surface and the back protective layer; and
a filler between the front protective layer and the plurality of solar cells, the filler covering the plurality of solar cells,
wherein
the filler comprises a material with a chemical structure to generate a free acid,
the front protective layer has a plurality of microthroughholes each extending from the first surface to the second surface, and the front protective layer is whether-resistant, and
at least a part of the first surface is exposed to a space external to the photovoltaic module.

* * * * *